United States Patent
Liu et al.

(10) Patent No.: US 7,606,184 B2
(45) Date of Patent: Oct. 20, 2009

(54) MULTIPLEXERS EMPLOYING BANDPASS-FILTER ARCHITECTURES

(75) Inventors: Kai Liu, Phoenix, AZ (US); Richard Kommrusch, Fort Collins, CO (US)

(73) Assignee: TDK Corporation, Tokyo (JP)

( * ) Notice: Subject to any disclaimer, the term of this patent is extended or adjusted under 35 U.S.C. 154(b) by 986 days.

(21) Appl. No.: 11/029,664

(22) Filed: Jan. 4, 2005

(65) Prior Publication Data

US 2006/0145782 A1 Jul. 6, 2006

(51) Int. Cl.
*H04L 5/00* (2006.01)
(52) U.S. Cl. .................................................. 370/297
(58) Field of Classification Search ........................ None
See application file for complete search history.

(56) References Cited

U.S. PATENT DOCUMENTS

| | | | |
|---|---|---|---|
| 3,471,856 A | 10/1969 | Laughlin, Jr. et al. | |
| 4,677,686 A | 6/1987 | Husting et al. | |
| 5,021,756 A * | 6/1991 | Tajima et al. | 333/132 |
| 5,155,724 A * | 10/1992 | Edwards | 370/297 |
| 5,463,656 A | 10/1995 | Polivka et al. | |
| 5,552,920 A | 9/1996 | Glynn | |
| 5,898,406 A | 4/1999 | Matero | |
| 6,072,993 A | 6/2000 | Trikha et al. | |
| 6,304,156 B1 | 10/2001 | Ishizaki et al. | |
| 6,336,564 B1 | 4/2002 | Hiraka et al. | |
| 6,366,564 B1 * | 4/2002 | Hiraka et al. | 370/275 |
| 6,381,471 B1 | 4/2002 | Dvorkin | |
| 6,411,178 B1 * | 6/2002 | Matsumura et al. | 333/134 |
| 6,414,567 B2 | 7/2002 | Matsumura et al. | |
| 6,429,819 B1 | 8/2002 | Bishop et al. | |
| 6,445,262 B1 | 9/2002 | Tanaka et al. | |
| 6,473,053 B1 | 10/2002 | Krishmar-Junker et al. | |
| 6,512,489 B2 | 1/2003 | Boyle | |
| 6,563,396 B2 | 5/2003 | Tanaka et al. | |
| 6,633,748 B1 | 10/2003 | Watanabe et al. | |
| 6,662,021 B2 | 12/2003 | Kang et al. | |
| 6,690,176 B2 | 2/2004 | Toncich | |

(Continued)

FOREIGN PATENT DOCUMENTS

DE 19853484 5/1999

(Continued)

OTHER PUBLICATIONS

Ko et al, A Miniaturized LTCC Multi-layered Front-end Module for Dual Band WLAN (802.11a/b/g) Applications, IEEE, vol. 2, pp. 563-566, Jun. 2004.*

*Primary Examiner*—Frank Duong
(74) *Attorney, Agent, or Firm*—Allen J. Moss; Alex Starkovich; Squire, Sanders & Demspey L.L.P.

(57) ABSTRACT

A multiplexer, such as a diplexer, is delineated. The multiplexer may be employed in a communications system that may communicate in multiple frequency bands within a predefined range of frequencies, e.g., 2400 MHz-4900 MHz. The communications system may operate in a network, such as a wireless local area network, without significant interference from signals used by a cellular/mobile telephone system. The multiplexer may include multiple channels with bandpass filters that may be formed with lumped inductors and lumped capacitors. In at least one of the channels, the bandpass filter may be formed by combining at least one lowpass filter with at least one highpass filter.

12 Claims, 22 Drawing Sheets

U.S. PATENT DOCUMENTS

| | | |
|---|---|---|
| 6,694,150 B1 | 2/2004 | Standke et al. |
| 6,734,767 B2 | 5/2004 | Vanoverscheld et al. |
| 6,825,818 B2 | 11/2004 | Toncich |
| 7,389,090 B1 * | 6/2008 | Kubota et al. ............... 455/82 |
| 2003/0092397 A1 | 5/2003 | Uriu et al. |
| 2003/0124984 A1 | 7/2003 | Shin et al. |
| 2003/0186667 A1 | 10/2003 | Wallace |
| 2003/0227575 A1 | 12/2003 | Plonka |
| 2004/0057534 A1 | 3/2004 | Masenten et al. |
| 2004/0127185 A1 | 7/2004 | Abrahams et al. |
| 2004/0155731 A1 | 8/2004 | Toncich |

FOREIGN PATENT DOCUMENTS

| | | |
|---|---|---|
| EP | 0 959 567 A1 | 11/1999 |
| EP | 1378959 | 1/2004 |
| EP | 1601112 | 11/2005 |
| JP | 01177706 | 7/1989 |
| JP | 09-181549 A | 7/1997 |
| JP | 11-031905 A | 2/1999 |
| JP | 2001177432 | 6/2001 |
| JP | 2002141764 | 5/2002 |
| JP | 2002-299988 | 10/2002 |
| JP | 2002299988 | 10/2002 |
| JP | 2003008385 | 1/2003 |
| JP | 2003-069362 | 3/2003 |
| JP | 2003069362 | 3/2003 |
| WO | WO2004073191 | 8/2004 |

* cited by examiner

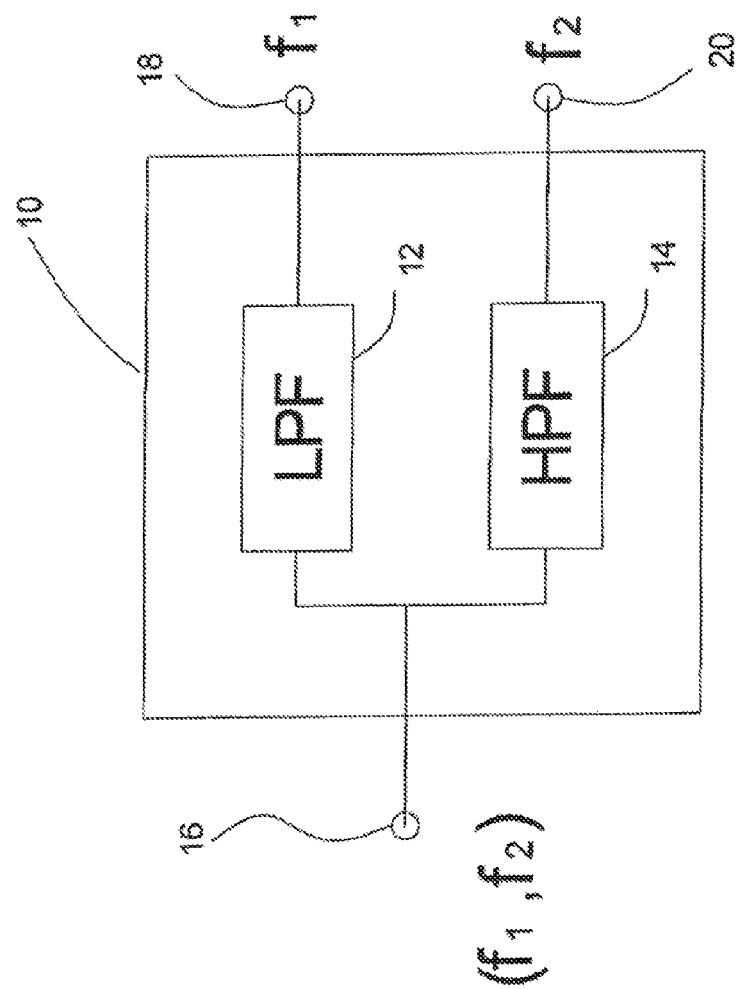

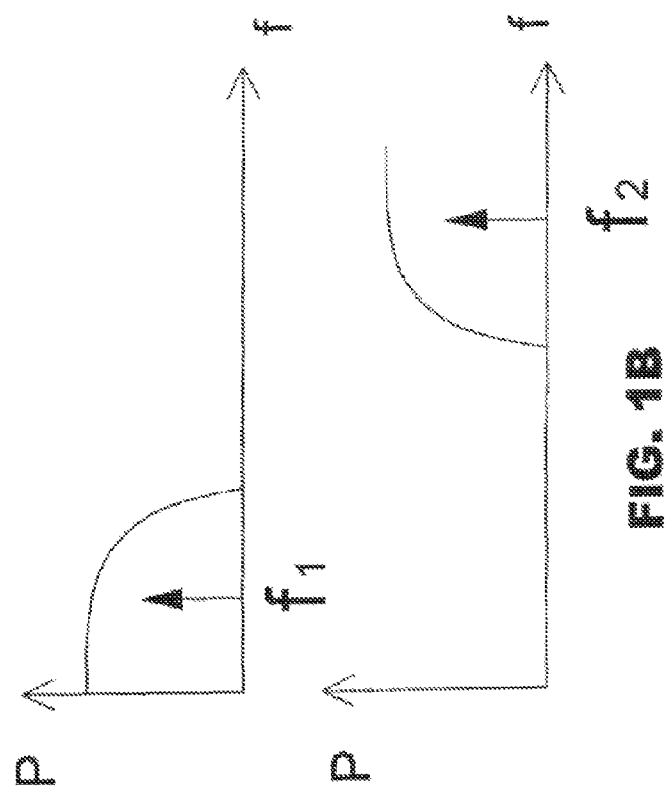
--PRIOR ART--

--PRIOR ART--

--PRIOR ART--

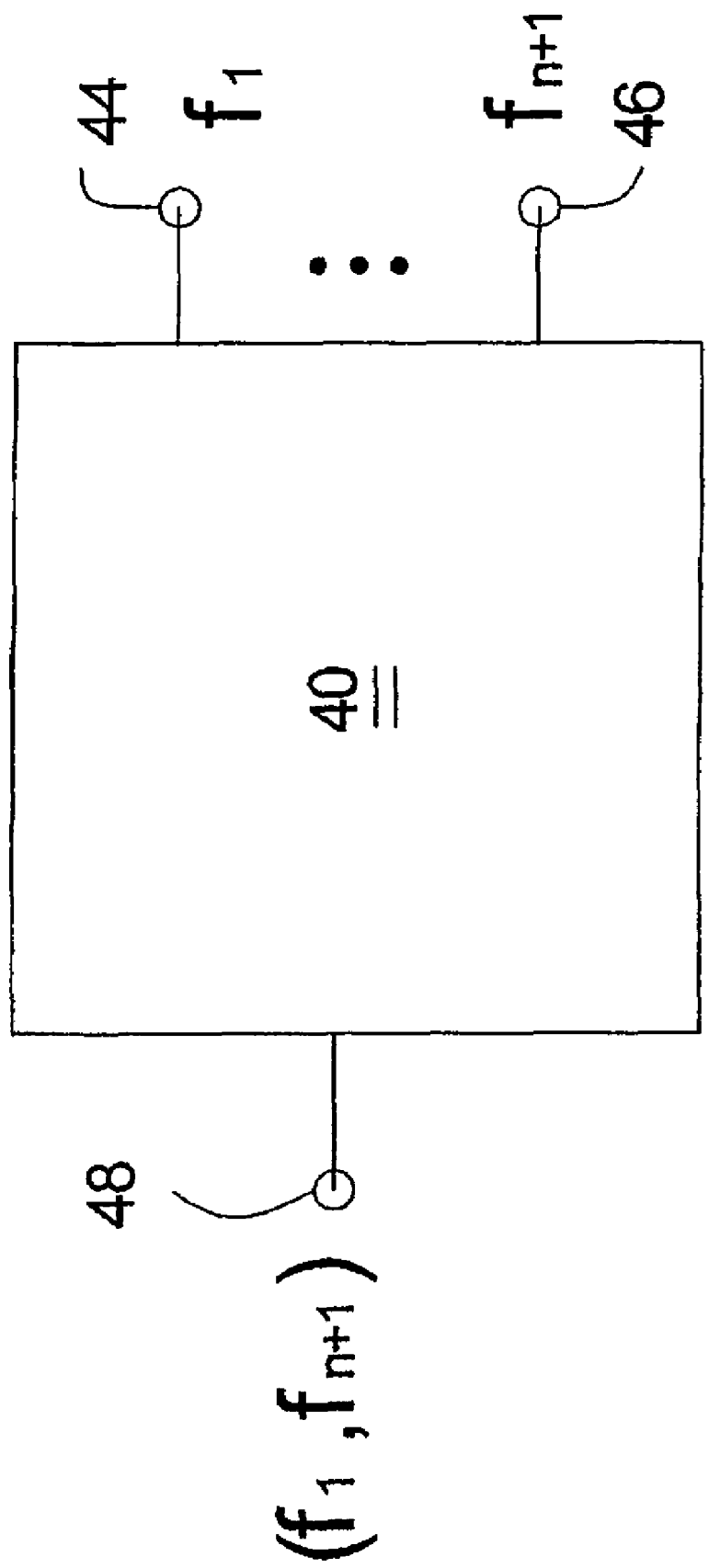

MULTIPLEXERS EMPLOYING BANDPASS-FILTER ARCHITECTURES

FIELD OF THE INVENTION

The present invention relates to systems employing multiplexers, and more particularly, to systems employing multiplexers with bandpass-filter architectures.

BACKGROUND OF THE INVENTION

As used herein and throughout, the terms in quotations below are defined as follows:
  a. The term "bandpass filter" may refer to a filter that may pass signals at frequencies within a specified frequency band and may reject signals at frequencies above the specified frequency band, as well as signals at frequencies below the specified frequency band.
  b. The term "diplexer" may refer to a three-port frequency-dependent device that may be used as a separator and/or a combiner of signals.
  c. The term "highpass filter" may refer to a filter that may pass signals at frequencies above a specified frequency and may reject signals at frequencies below the specified frequency.
  d. The term "lowpass filter" may refer to a filter that may pass signals at frequencies below a specified frequency and may reject signals at frequencies above the specified frequency
  e. The term "multiplexer" may refer to a multi-port frequency-dependent device that may be used as a separator and/or a combiner of signals.
  f. The term "triplexer" may refer to a four-port frequency-dependent device that may be used as a separator and/or a combiner of signals.

A variety of communications systems today may operate in multiple frequency bands. For example, a mobile telephone may operate over multiple frequency bands, such as those bands for telephones operable in the EGSM (Extended Global System for Mobile communications) system and the DCS (Digital Cellular System) system. Communications systems that may operate in multiple frequency bands, e.g., two frequency bands, may employ a diplexer to (1) separate received signals into signals in multiple frequency bands for use by the communications system and/or (2) combine signals from multiple frequency bands for transmission by the communications system.

FIG. 1A shows a block diagram of a prior art diplexer 10. Diplexer 10 includes a lowpass filter 12 and a highpass filter 14, and may be characterized as employing a lowpass-highpass-filter architecture. A terminal of lowpass filter 12 is coupled to a terminal 16 and the other terminal of lowpass filter 12 is coupled to a terminal 18. Similarly, a terminal of highpass filter 14 is coupled to terminal 16 and the other terminal of highpass filter 14 is coupled to a terminal 20. A communications system (not shown) employing diplexer 10 may include an antenna (not shown) coupled to terminal 16 and signal processing circuitry (not shown), e.g., receiver circuitry and/or transmitter circuitry, coupled to terminals 18 and/or 20.

In operation, a communications system employing diplexer 10 may receive over its antenna signals in multiple frequency bands, e.g., signals in one frequency band including frequency $f_1$ and signals in another frequency band including frequency $f_2$. Diplexer 10 may receive and input these signals to lowpass filter 12 and to highpass filter 14. As represented in FIG. 1B, lowpass filter 12 may pass to terminal 18 signals in a lowpass frequency band, including frequency $f_1$. FIG. 1B also shows that highpass filter 14 may pass to terminal 20 signals in a highpass frequency band, including frequency $f_2$. The separated signals at terminals 18 and 20 may be employed by the communications system's signal processing circuitry, e.g., receiver circuitry and/or transmitter circuitry, coupled to terminals 18 and/or 20. Alternatively, the communications system's signal processing circuitry may supply signals at terminals 18 and 20 to lowpass filter 12 and to highpass filter 20, respectively, to form a combined signal at terminal 16 for transmission by the communications system.

A problem associated with the lowpass-highpass-filter architecture of diplexer 10 is that signals at undesired frequency bands may be passed by lowpass filter 12 and/or highpass filter 14. For example, referring to FIG. 1B, the desired frequency band around frequency $f_1$ may comprise a frequency range that is less than the full range of frequencies passed by lowpass filter 12. Signals at frequencies passed by lowpass filter 12 that are outside of the desired frequency band around frequency $f_1$ may interfere with the desired operation of the communications system. Similarly, the desired frequency band around frequency $f_2$ may comprise a frequency range that is less than the full range of frequencies passed by highpass filter 14. Signals at frequencies passed by highpass filter 14 that are outside of the desired frequency band around frequency $f_2$ may also interfere with desired operation of the communications system.

To address the potential interference problem, as described above for diplexer 10, some communications systems may employ a diplexer 22, as shown in FIG. 2A. Diplexer 22 includes a bandpass filter 24 and a bandpass filter 26, and may be characterized as employing a bandpass-bandpass-filter architecture. A terminal of bandpass filter 24 is coupled to a terminal 28 and the other terminal of bandpass filter 24 is coupled to a terminal 30. Similarly, a terminal of bandpass filter 26 is coupled to terminal 28 and the other terminal of bandpass filter 26 is coupled to a terminal 32. A communications system (not shown) employing diplexer 22 may include an antenna (not shown) coupled to terminal 28 and signal processing circuitry (not shown), e.g., receiver circuitry and/or transmitter circuitry, coupled to terminals 30 and/or 32.

In operation, a communications system employing diplexer 22 may receive over its antenna signals in multiple frequency bands, e.g., signals in one frequency band including frequency $f_1$ and signals in another frequency band including frequency $f_2$. Diplexer 22 may receive and input these signals to bandpass filter 24 and to bandpass filter 26. As represented in FIG. 2B, bandpass filter 24 may pass to terminal 30 signals in a passband frequency band, including frequency $f_1$. FIG. 2B also shows that bandpass filter 26 may pass to terminal 32 signals in a bandpass frequency band, including frequency $f_2$. The separated signals at terminals 30 and 32 may be employed by the communications system's signal processing circuitry, e.g., receiver circuitry and/or transmitter circuitry, coupled to terminals 30 and/or 32. Alternatively, the communications system's signal processing circuitry may supply signals at terminals 30 and 32 to bandpass filter 24 and to bandpass filter 26, respectively, to form a combined signal at terminal 28 for transmission by the communications system.

U.S. Pat. No. 6,304,156 (hereafter the "'156 patent") and U.S. Pat. No. 6,414,567 (hereafter the "'567 patent") disclose bandpass-bandpass-filter architectures in duplexers, similar to diplexer 22.

Regarding the '156 patent, FIG. 39 shows a circuit diagram for a duplexer 500, including a transmission filter 501 and a reception filter 502. The transmission filter 501 includes strip line resonators 511, 512, 513 that are resonators composed of front end short-circuit transmission lines shorter than the quarter wavelength. The strip line resonators 511, 512, 513 are mutually coupled by an electromagnetic field, and a band pass characteristic is provided. The reception filter 502 includes strip line resonators 521, 522, 523 that are also composed of front end short-circuit transmission lines shorter than the quarter wavelength. The strip line resonators 521, 522, 523 are also mutually coupled by an electromagnetic field, and a band pass characteristic is provided.

Regarding the '567 patent, FIG. 3 shows an electrical circuit for a duplexer 41, including resonators Q1 to Q3 that are electrically coupled to each other via coupling capacitors Cs1 and Cs2 to provide a three-stage bandpass filter BPF1. Duplexer 41 also includes resonators Q4 to Q6 that are electrically coupled to each other via coupling capacitors Cs3 and Cs4 to provide a the three-stage bandpass filter BPF2.

The bandpass-bandpass-filter architectures in the duplexers of the '156 patent and the '567 patent have at least the following disadvantages. First, when combining bandpass filters to form a duplexer, it is difficult to properly match the filter impedances to obtain the desired performance for each bandpass filter. For example, prior art duplexers may have for the channel of one bandpass filter short-circuit-like impedance at the other channel's passband. Consequently, passband performance may suffer due to the impedance mismatching often found in prior art duplexers employing bandpass-bandpass-filter architecture. Second, it is difficult to adjust a pole in a bandpass filter to provide a desired attenuation pattern, without simultaneously altering in an undesired manner another portion of the attenuation pattern. This is because adjustment of a pole in a bandpass filter tends to also move one or more other poles in the bandpass filter, which may tend to alter the attenuation pattern of the bandpass filter in an undesired manner.

Thus, there is a need for multiplexers, which overcome these and other problems of the prior art.

SUMMARY OF THE INVENTION

In accordance with an embodiment of the invention, a multiplexer is disclosed for separating an input signal into at least a first output signal in a first frequency band and a second output signal in a second frequency band, the multiplexer comprising a first bandpass filter having an input for receiving the input signal and an output for passing the first output signal, wherein the first bandpass filter comprises at least a lowpass filter and a highpass filter; and a second bandpass filter having an input for receiving the input signal and an output for passing the second output signal.

In accordance with another embodiment of the invention, a multiplexer is disclosed for separating an input signal into at least a first output signal in a first frequency band and a second output signal in a second frequency band, the multiplexer comprising a first bandpass filter having an input for receiving the input signal and an output for passing the first output signal, wherein the first bandpass filter comprises at least a first lowpass filter and a first highpass filter; and a second bandpass filter having an input for receiving the input signal and an output for passing the second output signal, wherein the second bandpass filter comprises at least a second lowpass filter and a second highpass filter.

In accordance with a further embodiment of the invention, a communications system is disclosed comprising an antenna; and a communications device coupled to receive an input signal from the antenna, wherein the communications device includes a multiplexer for separating the input signal into at least a first output signal in a first frequency band and a second output signal in a second frequency band, the multiplexer comprising a first bandpass filter having an input for receiving the input signal and an output for passing the first output signal to a first portion of the communications device, wherein the first bandpass filter comprises at least a lowpass filter and a highpass filter; and a second bandpass filter having an input for receiving the input signal and an output for passing the second output signal to a second portion of the communications device.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 1A is a block diagram of a prior art diplexer.

FIG. 1B is a frequency response diagram for the diplexer of FIG. 1A.

FIG. 4 is a block diagram of an embodiment of a multiplexer for use by the communications system of FIG. 3, in accordance with systems and methods consistent with the present invention.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

Figure 2A:
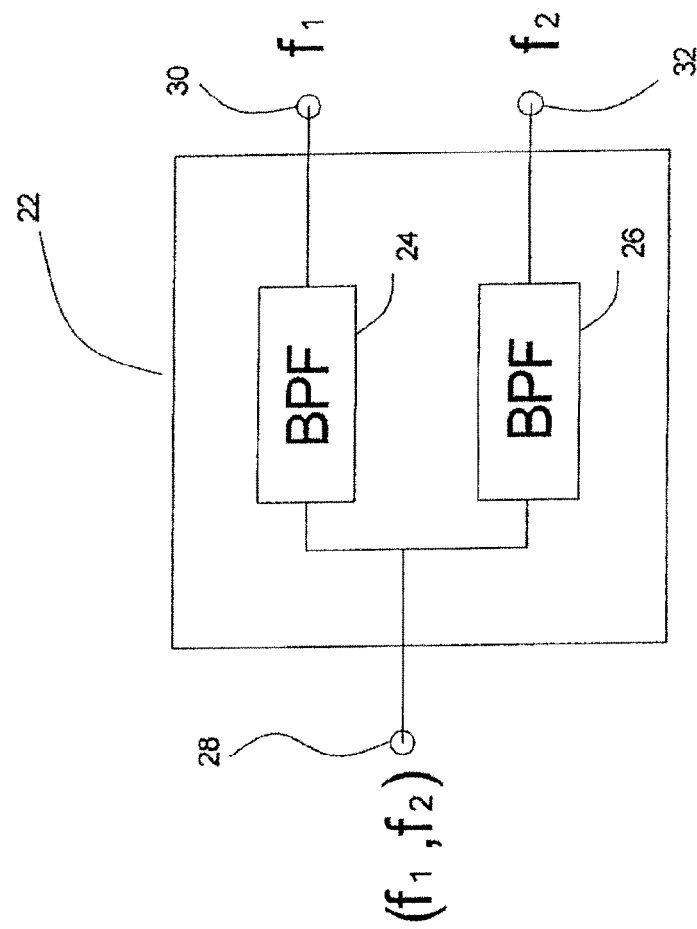
FIG. 2A is a block diagram of a prior art diplexer.
Figure 2B:
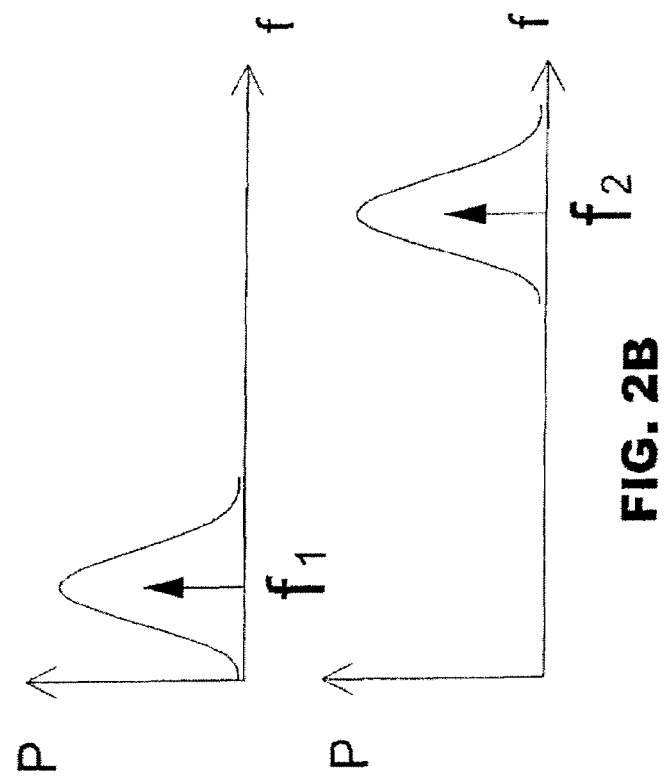
FIG. 2B is a frequency response diagram for the diplexer of FIG. 2A.
Figure 3:
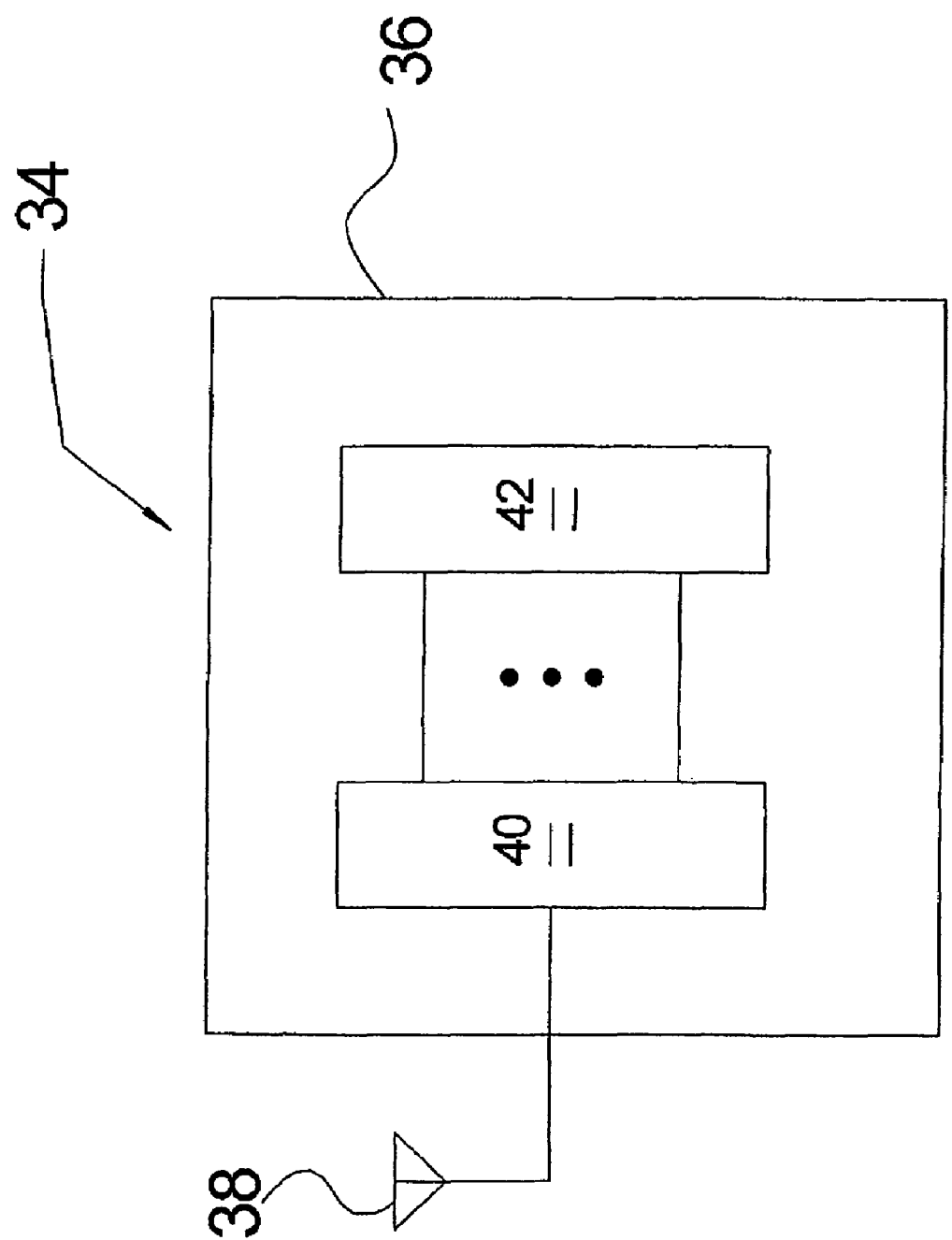
FIG. 3 is a block diagram of an embodiment of a communications system, in accordance with systems and methods consistent with the present invention.

FIG. 3 is a block diagram of an embodiment of a communications system 34, in accordance with systems and methods consistent with the present invention. System 34 may comprise any structure for receiving and/or transmitting signals for conveying information of any kind in more than one frequency band. System 34 may include, for example, an antenna 38 coupled to a communications device 36.

Antenna 38 may comprise any structure, such as one or more antennae, for receiving signals for communications device 36 and/or for transmitting signals from communications device 36.

Communications device 36 may comprise any structure, which may include one or more devices, for receiving and/or transmitting signals for conveying information of any kind in more than one frequency band. Communications device 36 may include a multiplexer 40 that may be coupled to communications device circuitry 42. Multiplexer may comprise a multi-port frequency-dependent device, such as a diplexer, a triplexer, or the like, that may be used as a separator and/or a combiner of signals. Communications device circuitry 42 may comprise any structure that may work in conjunction with multiplexer 40 to receive and/or transmit signals for conveying information of any kind in more than one frequency band.

In a preferred embodiment, communications system 34 may be used to convey information over a network, such as a wireless local area network, employing multiple channels in multiple frequency bands within a predefined frequency range, e.g., 2400 MHz to 5900 MHz. For example, a first communications channel may utilize frequencies of the IEEE 802.11.B/G scheme, i.e., 2400 MHz-2500 MHz (hereafter the "2G channel"). A second communications channel may utilize frequencies of the IEEE 802.11A scheme, i.e., 4900 MHz-5900 MHz (hereafter the "5G channel").

In a variation of the preferred embodiment, communications system 34 may be operated in the presence of signals employed by cellular telephones. For example, communications system 34 may be operated in the presence of signals employed by cellular telephones operable in the PCS (personal Communications Service) scheme, i.e., 1990 MHz. Accordingly, in this variation of the preferred embodiment, the 2G channel of communications system 34 may attenuate signals employed by cellular telephones, such as the PCS band, i.e., 1990 MHz, in addition to signals in the 5G channel, i.e., 4900 MHz-5900 MHz.

FIG. 4 is a block diagram of an embodiment of multiplexer 40 for use by communications system 34 of FIG. 3, in accordance with systems and methods consistent with the present invention. Multiplexer 40 may comprise a multi-port frequency-dependent device, such as a diplexer, a triplexer, or the like, that may be used as a separator and/or a combiner of signals. Multiplexer 40 may include a terminal 48 for receiving and/or transmitting signals that may include frequencies $f_1$ to $f_{(n+1)}$, where "n" is an integer greater than or equal to 1. Additionally, frequency $f_1$ may be less than frequency $f_{(n+1)}$. Multiplexer 40 may also include a terminal 44 for receiving and/or transmitting signals that may include frequency $f_1$ and a terminal 46 for receiving and/or transmitting signals that may include frequency $f_{(n+1)}$.

In a preferred embodiment, multiplexer 40 may comprise a diplexer with three terminals 44-48. In a diplexer embodiment of multiplexer 40, terminal 48 may receive and/or transmit signals that may include frequencies $f_1$ to $f_2$, where frequency $f_1$ may be less than frequency $f_2$. Terminal 44 may receive and/or transmit signals that may include frequency $f_1$ and terminal 46 may receive and/or transmit signals that may include frequency $f_2$. For purposes of simplification, each embodiment of multiplexer 40 in FIGS. 5-8 is shown as a diplexer, however, multiplexer 40 may include more than three terminals 44-48, as shown in the diplexer embodiments.

Each diplexer embodiment shown in FIGS. 5-8 may employ bandpass-bandpass-filter architecture, i.e., each channel of the respective diplexer embodiments may employ a bandpass filter. Lumped capacitors and lumped inductors may be used to form each bandpass filter in the diplexer embodiments of FIGS. 5-8. The bandpass filters may be formed either by combining one or more lowpass filters with one or more highpass filters, or by employing a bandpass filter that is not formed by combining one or more lowpass filters with one or more highpass filters. Each bandpass filter may be fabricated using any known fabrication process, including the formation of the bandpass filters by a plurality of material layers adapted to form lumped inductors and lumped capacitors.

Figure 5A:
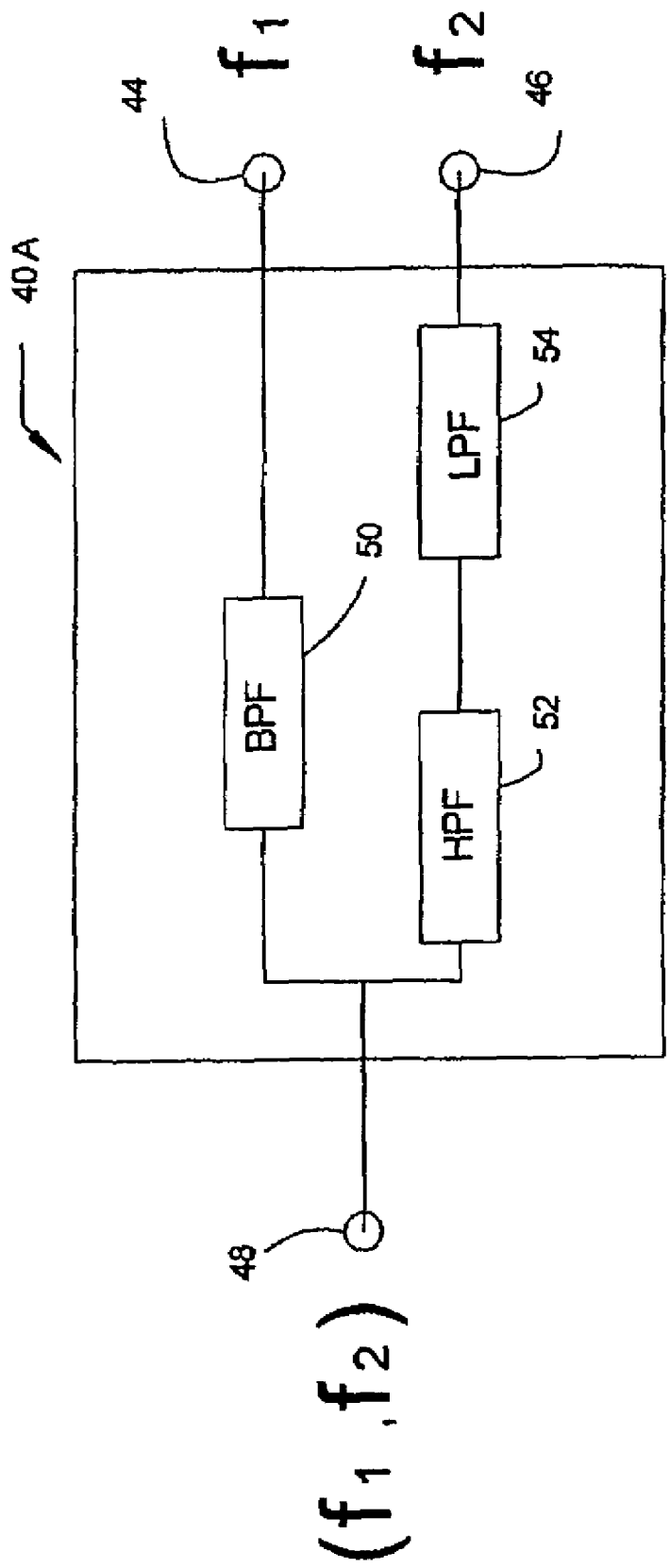
FIG. 5A is a block diagram of an embodiment of a diplexer for use by the communications system of FIG. 3, in accordance with systems and methods consistent with the present invention.

FIG. 5A is a block diagram of an embodiment of a diplexer 40A for use by communications system 34 of FIG. 3, in accordance with systems and methods consistent with the present invention. Diplexer 40A may include three terminals 44-48. Terminal 48 may receive and/or transmit signals that may include frequencies $f_1$ to $f_2$, where frequency $f_1$ may be less than frequency $f_2$. Terminal 44 may receive and/or transmit signals that may include frequency $f_1$ and terminal 46 may receive and/or transmit signals that may include frequency $f_2$.

Diplexer 40A may include a first channel, e.g., the 2G channel, between terminals 48 and 44. In the first channel, diplexer 40A may receive signals, including frequencies $f_1$ and $f_2$, at terminal 48 and employ a bandpass filter 50 to pass signals at frequency $f_1$ to terminal 44. In the first channel, diplexer 40A may also receive from terminal 44 signals, including frequency $f_1$, and employ bandpass filter 50 to pass signals including frequency $f_1$ to terminal 48.

Diplexer 40A may also include a second channel, e.g., the 5G channel, between terminals 48 and 46. In the second channel, diplexer 40A may receive signals, including frequencies $f_1$ and $f_2$, at terminal 48 and employ a bandpass filter, which may comprise a highpass filter 52 and a lowpass filter 54, to pass signals at frequency $f_2$ to terminal 46. In the second channel, diplexer 40A may also receive from terminal 46 signals, including frequency $f_2$, and employ a bandpass filter, which may comprise highpass filter 52 and lowpass filter 54, to pass signals including frequency $f_2$ to terminal 48. Employing highpass filter 52 and lowpass filter 54 to form a bandpass filter in the second channel may ease the task of impedance matching between the first and second channels. Specifically, highpass filter 52 may provide high impendence, e.g., open-circuit impedance, at the passband frequency of the first channel.

Figure 5B:
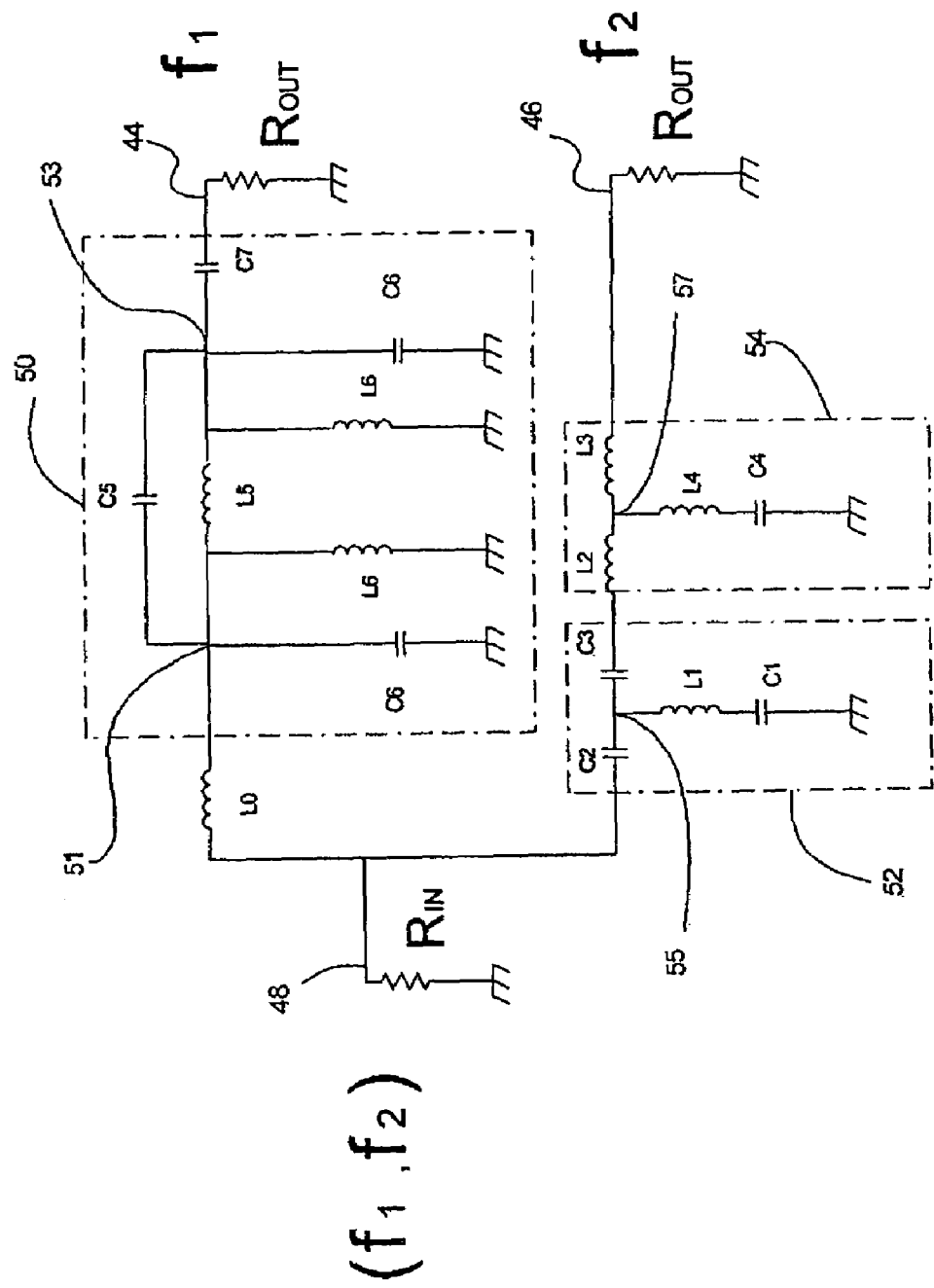
FIG. 5B is an electrical schematic diagram, including the diplexer of FIG. 5A, in accordance with systems and methods consistent with the present invention.

FIG. 5B is an electrical schematic diagram, including diplexer 40A of FIG. 5A, in accordance with systems and methods consistent with the present invention. An input load $R_{IN}$ may be tied from terminal 48 to ground. The input load $R_{IN}$ may represent one or more antennae 38 in communications system 34, as shown in FIG. 3. An output load $R_{OUT}$ may be tied from terminal 44 to ground. This output load $R_{OUT}$ may represent device circuitry 42 in communications system 34. An output load $R_{OUT}$ may be tied from terminal 46 to ground. This output load $R_{OUT}$ may also represent device circuitry 42 in communications system 34.

Regarding the first channel, e.g., the 2G channel, between terminals 48 and 44, an inductor L0 may be coupled between terminal 48 and bandpass filter 50. The inductance value of inductor L0 may be selected to provide desired impedance matching between bandpass filter 50 and the second channel, e.g., the 5G channel, between terminals 48 and 46.

Still regarding the first channel, bandpass filter 50 may comprise a capacitor C5, a pair of capacitors C6, a capacitor C7, an inductor L5 and a pair of inductors L6. Capacitance values for capacitors C5, C6 and C7 and inductance values for inductors L5 and L6 may be selected to form bandpass filter 50 with any desired bandpass filter performance. One of the pair of capacitors C6 may be coupled between a node 51 and ground. The other of the pair of capacitors C6 may be coupled between a node 53 and ground. Similarly, one of the pair of inductors L6 may be coupled between node 51 and ground. The other of the pair of inductors L6 may be coupled between node 53 and ground. Inductor L5 and capacitor C5 may be coupled in parallel between nodes 51 and 53. Capacitor C7 may be coupled between node 53 and terminal 44.

Regarding the second channel, e.g., the 5G channel, highpass filter 52 may be coupled with lowpass filter 54, between terminals 48 and 46. Highpass filter 52 may comprise capacitors C1, C2 and C3 and inductor L1. Capacitance values for capacitors C1, C2 and C3 and the inductance value of inductor L1 may be selected to form highpass filter 52 with any desired highpass filter performance. Capacitor C2 may be coupled between terminal 48 and a node 55. Inductor L1 and capacitor C1 may be coupled in series between node 55 and ground. Capacitor C3 may be coupled between node 55 and lowpass filter 54.

Lowpass filter 54 may comprise capacitor C4 and inductors L2, L3 and L4. The capacitance value for capacitor C4 and the inductance values of inductors L2, L3 and L4 may be selected to form lowpass filter 54 with any desired lowpass filter performance. Inductor L2 may be coupled between highpass filter 52 and a node 57. Inductor L4 and capacitor C4 may be coupled in series between node 57 and ground. Inductor L3 may be coupled between node 57 and terminal 46.

Figure 6A:
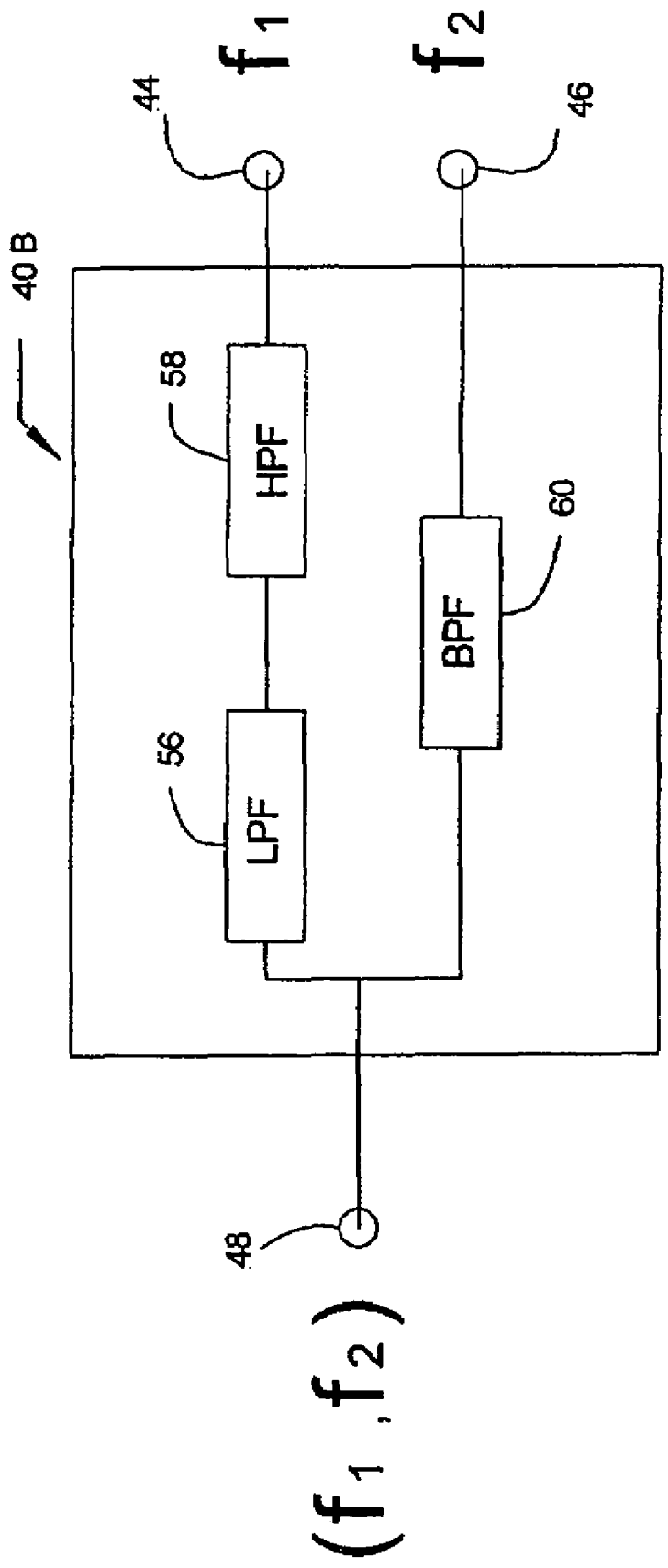
FIG. 6A is a block diagram of another embodiment of a diplexer for use by the communications system of FIG. 3, in accordance with systems and methods consistent with the present invention.

FIG. 6A is a block diagram of another embodiment of a diplexer 40B for use by communications system 34 of FIG. 3, in accordance with systems and methods consistent with the present invention. Diplexer 40B may include three terminals 44-48. Terminal 48 may receive and/or transmit signals that may include frequencies $f_1$ to $f_2$, where frequency $f_1$ may be less than frequency $f_2$. Terminal 44 may receive and/or transmit signals that may include frequency $f_1$ and terminal 46 may receive and/or transmit signals that may include frequency $f_2$.

Diplexer 40B may include a first channel, e.g., the 2G channel, between terminals 48 and 44. In the first channel, diplexer 40B may receive signals, including frequencies $f_1$ and $f_2$, at terminal 48 and employ a bandpass filter, which may comprise a lowpass filter 56 and a highpass filter 58, to pass signals at frequency $f_1$ to terminal 44. In the first channel, diplexer 40B may also receive from terminal 44 signals, including frequency $f_1$, and employ the bandpass filter, which may comprise lowpass filter 56 and highpass filter 58, to pass signals including frequency $f_1$ to terminal 48. Employing lowpass filter 56 and highpass filter 58 to form the bandpass filter in the first channel may ease the task of impedance matching between the first and second channels. Specifically, lowpass filter 56 may provide high impendence, e.g., open-circuit impedance, at the passband frequency of the second channel.

Diplexer 40B may also include a second channel, e.g., the 5G channel, between terminals 48 and 46. In the second channel, diplexer 40B may receive signals, including frequencies $f_1$ and $f_2$, at terminal 48 and employ a bandpass filter 60 to pass signals at frequency $f_2$ to terminal 46. In the second channel, diplexer 40B may also receive from terminal 46 signals, including frequency $f_2$, and employ bandpass filter 60 to pass signals including frequency $f_2$ to terminal 48.

Figure 6B:
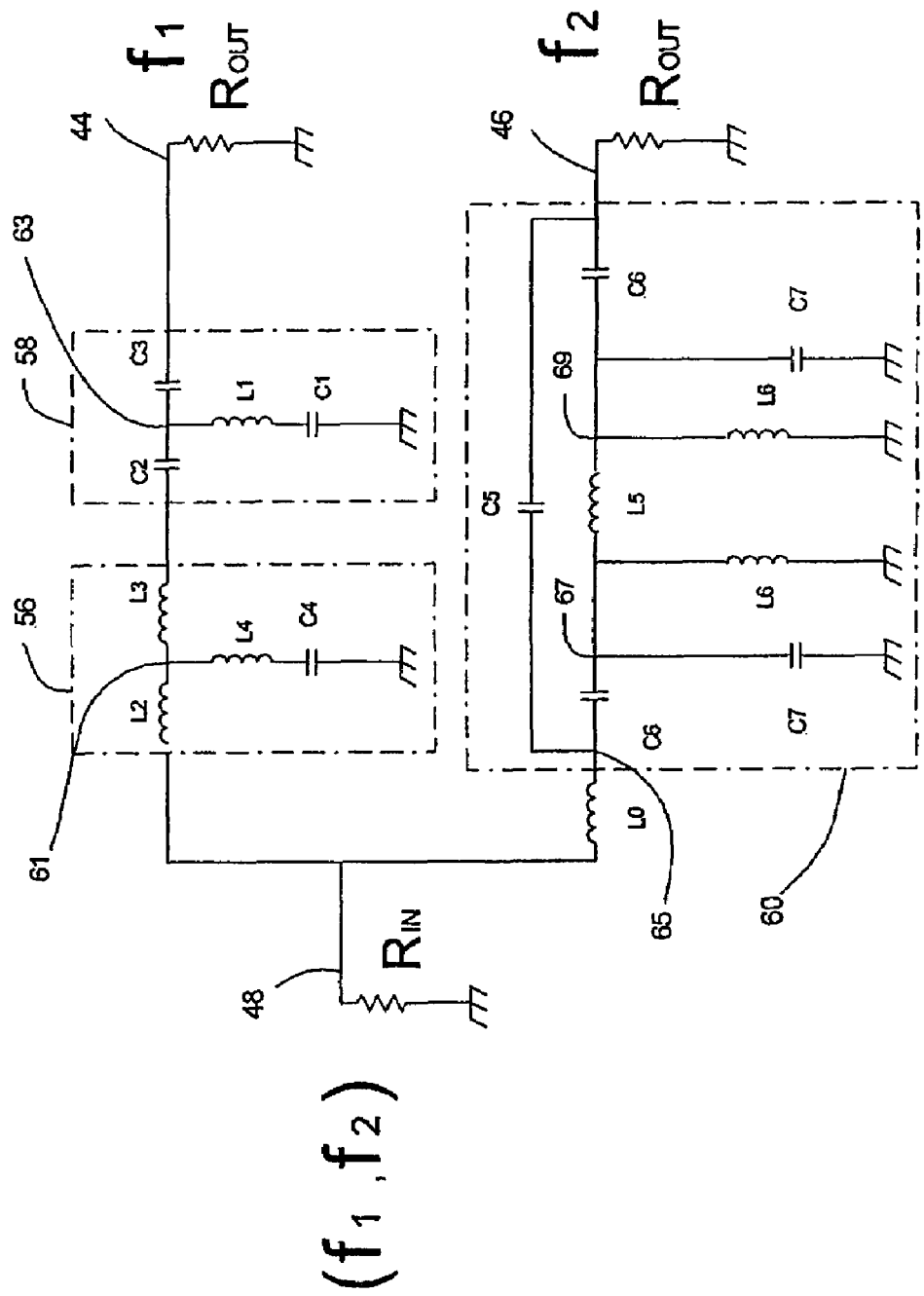
FIG. 6B is an electrical schematic diagram, including the diplexer of FIG. 6A, in accordance with systems and methods consistent with the present invention.

FIG. 6B is an electrical schematic diagram, including diplexer 40B of FIG. 6A, in accordance with systems and methods consistent with the present invention. An input load $R_{IN}$ may be tied from terminal 48 to ground. The input load $R_{IN}$ may represent one or more antennae 38 in communications system 34, as shown in FIG. 3. An output load $R_{OUT}$ may be tied from terminal 44 to ground. This output load $R_{OUT}$ may represent device circuitry 42 in communications system 34. An output load $R_{OUT}$ may be tied from terminal 46 to ground. This output load $R_{OUT}$ may also represent device circuitry 42 in communications system 34.

Regarding the first channel, e.g., the 2G channel, between terminals 48 and 44, lowpass filter 56 may be coupled with highpass filter 58, between terminals 48 and 44. Lowpass filter 56 may comprise a capacitor C4 and inductors L2, L3 and L4. The capacitance value for capacitor C4 and the inductance values of inductors L2, L3 and L4 may be selected to form lowpass filter 56 with any desired lowpass filter performance. Inductor L2 may be coupled between terminal 48 and a node 61. Inductor L4 and capacitor C4 may be coupled in series between node 61 and ground. Inductor L3 may be coupled between node 61 and highpass filter 58.

Highpass filter 58 may comprise capacitors C1, C2 and C3 and an inductor L1. Capacitance values for capacitors C1, C2 and C3 and the inductance value of inductor L1 may be selected to form highpass filter 58 with any desired highpass filter performance. Capacitor C2 may be coupled between lowpass filter 56 and a node 63. Inductor L1 and capacitor C1 may be coupled in series between node 63 and ground. Capacitor C3 may be coupled between node 63 and terminal 44.

Regarding the second channel, e.g., the 5G channel, an inductor L0 may be coupled between terminal 48 and bandpass filter 60. The inductance value of inductor L0 may be selected to provide desired impedance matching between bandpass filter 60 and the first channel, e.g., the 2G channel, between terminals 48 and 44.

Still regarding the second channel, bandpass filter 60 may comprise a capacitor C5, a pair of capacitors C6, a pair of capacitors C7, inductor L5 and a pair of inductors L6. Capacitance values for capacitors C5, C6 and C7 and inductance values of inductors L5 and L6 may be selected to form bandpass filter 60 with any desired bandpass filter performance. Capacitor C5 may be coupled between a node 65 and terminal 46. One of the pair of capacitors C6 may be coupled between node 65 and a node 67. The other of the pair of capacitors C6 may be coupled between a node 69 and terminal 46. One of the pair of capacitors C7 may be coupled between node 67 and ground. The other of the pair of capacitors C7 may be coupled between node 69 and ground. Inductor L5 may be coupled between node 67 and node 69. One of the pair of inductors L6 may be coupled between node 67 and ground, and the other of pair of inductors L6 may be coupled between node 69 and ground.

Figure 7A:
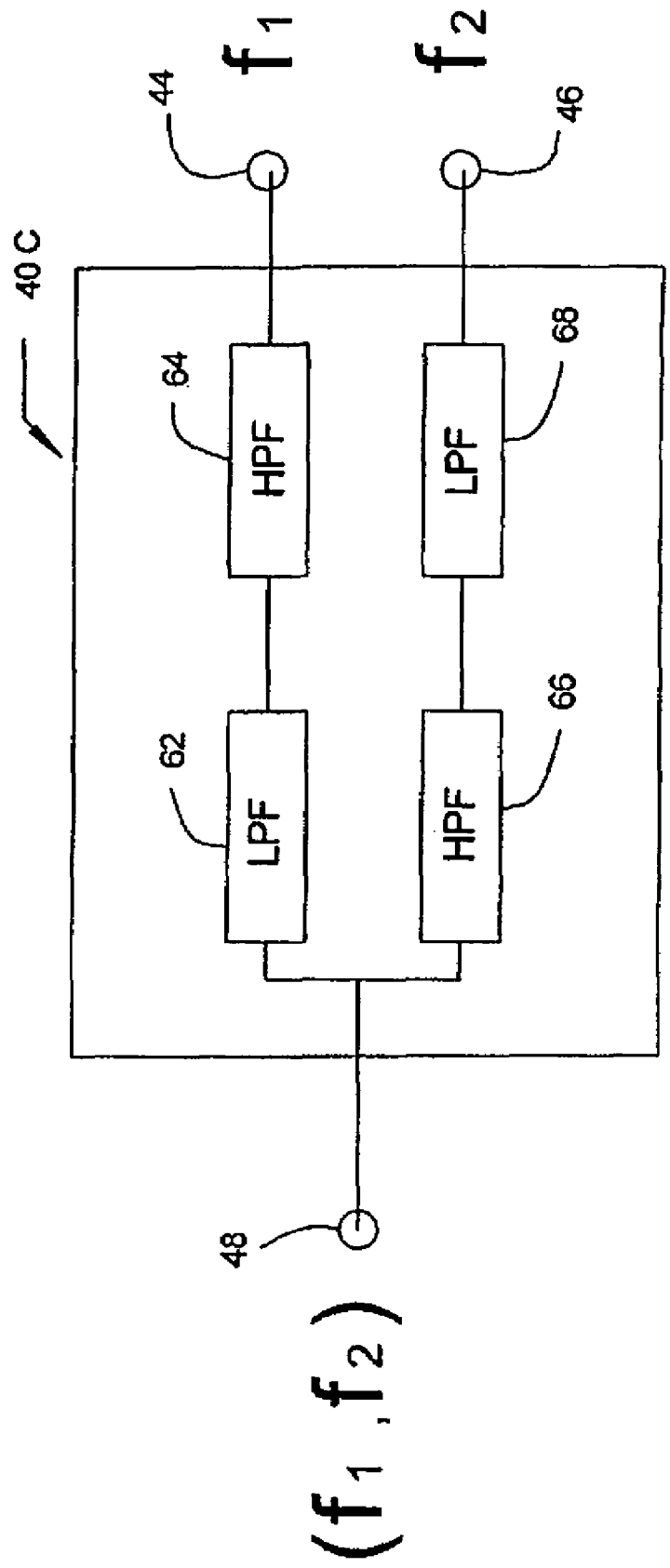
FIG. 7A is a block diagram of another embodiment of a diplexer for use by the communications system of FIG. 3, in accordance with systems and methods consistent with the present invention.

FIG. 7A is a block diagram of another embodiment of a diplexer 40C for use by communications system 34 of FIG. 3, in accordance with systems and methods consistent with the present invention. Diplexer 40C may include three terminals 44-48. Terminal 48 may receive and/or transmit signals that may include frequencies $f_1$ to $f_2$, where frequency $f_1$ may be less than frequency $f_2$. Terminal 44 may receive and/or transmit signals that may include frequency $f_1$ and terminal 46 may receive and/or transmit signals that may include frequency $f_2$.

Diplexer 40C may include a first channel, e.g., the 2G channel, between terminals 48 and 44. In the first channel, diplexer 40C may receive signals, including frequencies $f_1$ and $f_2$, at terminal 48 and employ a bandpass filter, which may comprise a lowpass filter 62 and a highpass filter 64, to pass signals at frequency $f_1$ to terminal 44. In the first channel, diplexer 40C may also receive from terminal 44 signals, including frequency $f_1$, and employ the bandpass filter, which may comprise lowpass filter 62 and highpass filter 64, to pass signals including frequency $f_1$ to terminal 48. Employing lowpass filter 62 and highpass filter 64 to form the bandpass filter in the first channel may ease the task of impedance matching between the first and second channels. Specifically, lowpass filter 62 may provide high impendence, e.g., open-circuit impedance, at the passband frequency of the second channel.

Diplexer 40C may also include a second channel, e.g., the 5G channel, between terminals 48 and 46. In the second channel, diplexer 40C may receive signals, including frequencies $f_1$ and $f_2$, at terminal 48 and employ a bandpass filter, which may comprise a highpass filter 66 and a lowpass filter 68, to pass signals at frequency $f_2$ to terminal 46. In the second channel, diplexer 40C may also receive from terminal 46 signals, including frequency $f_2$, and employ the bandpass filter, which may comprise highpass filter 66 and lowpass filter 68, to pass signals including frequency $f_2$ to terminal 48. Employing highpass filter 66 and lowpass filter 68 to form the bandpass filter in the second channel may ease the task of impedance matching between the first and second channels. Specifically, highpass filter 66 may provide high impendence, e.g., open-circuit impedance, at the passband frequency of the first channel.

Figure 7B:
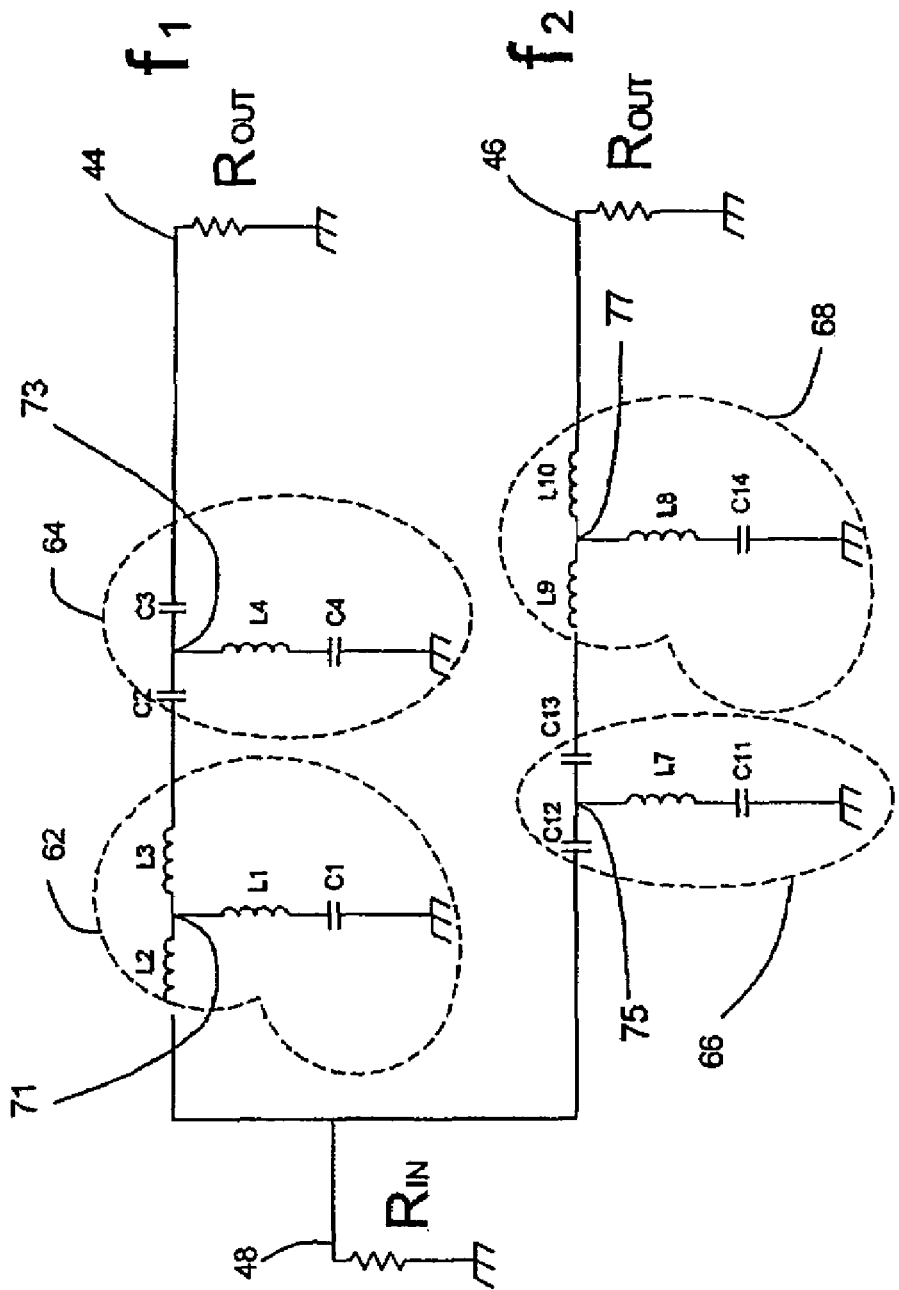
FIG. 7B is an electrical schematic diagram, including the diplexer of FIG. 7A, in accordance with systems and methods consistent with the present invention.

FIG. 7B is an electrical schematic diagram, including diplexer 40C of FIG. 7A, in accordance with systems and methods consistent with the present invention. An input load $R_{IN}$ may be tied from terminal 48 to ground. The input load $R_{IN}$ may represent one or more antennae 38 in communications system 34, as shown in FIG. 3. An output load $R_{OUT}$ may be tied from terminal 44 to ground. This output load $R_{OUT}$ may represent device circuitry 42 in communications system 34. An output load $R_{OUT}$ may be tied from terminal 46 to ground. This output load $R_{OUT}$ may also represent device circuitry 42 in communications system 34.

Regarding the first channel, e.g., the 2G channel, between terminals 48 and 44, a bandpass filter may comprise lowpass filter 62 and highpass filter 64. Lowpass filter 62 may include a capacitor C1 and inductors L1, L2 and L3. The capacitance value for capacitor C1 and the inductance values for inductors L1, L2 and L3 may be selected to form lowpass filter 62 with any desired lowpass filter performance. Inductor L2 may be coupled between terminal 48 and a node 71. Inductor L1 and capacitor C1 may be coupled in series between node 71 and ground. Inductor L3 may be coupled between node 71 and highpass filter 64.

Highpass filter 64 may include capacitors C2, C3 and C4 and an inductor L4. The capacitance values for capacitors C2, C3 and C4 and the inductance value for inductor L4 may be selected to form highpass filter 64 with any desired highpass filter performance. Capacitor C2 may be coupled between lowpass filter 62 and a node 73. Inductor L4 and capacitor C4 may be coupled in series between node 73 and ground. Capacitor C3 may be coupled between node 73 and terminal 44.

Regarding the second channel, e.g., the 5G channel, a bandpass filter may comprise highpass filter 66 and lowpass filter 68. Highpass filter 66 may include capacitors C11, C12 and C13 and an inductor L7. Capacitance values for capacitors C11, C12 and C13 and the inductance value of inductor L7 may be selected to form highpass filter 66 with any desired highpass filter performance. Capacitor C12 may be coupled between terminal 48 and a node 75. Inductor L7 and capacitor C11 may be coupled in series between node 75 and ground. Capacitor C13 may be coupled between node 75 and lowpass filter 68.

Lowpass filter 68 may include a capacitor C14 and inductors L8, L9 and L10. The capacitance value for capacitor C14 and the inductance values of inductors L8, L9 and L10 may be selected to form lowpass filter 68 with any desired lowpass filter performance. Inductor L9 may be coupled between highpass filter 66 and a node 77. Inductor L8 and capacitor C14 may be coupled in series between node 77 and ground. Inductor L10 may be coupled between node 77 and terminal 46.

Figure 7C:
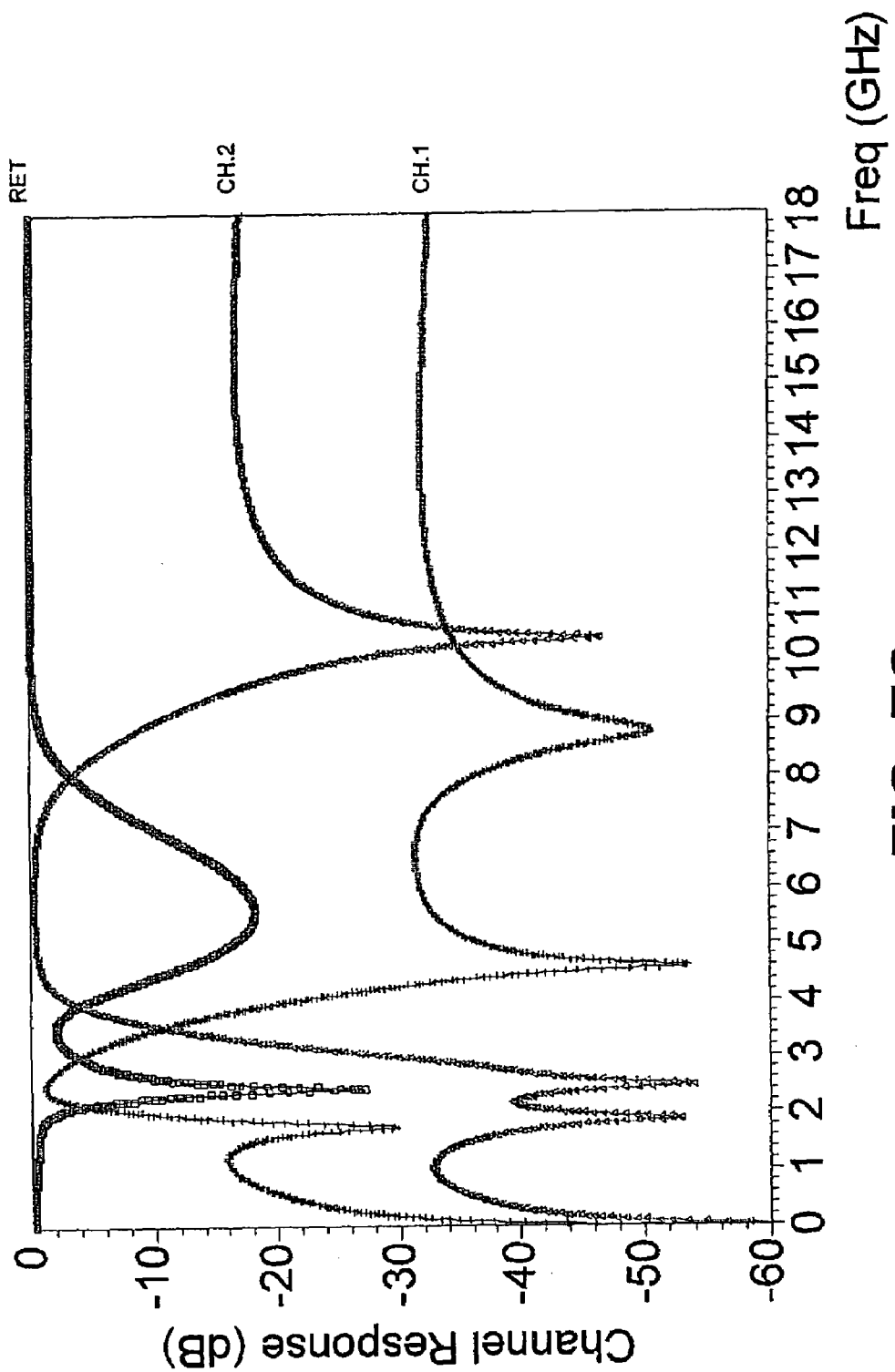
FIG. 7C is a frequency response diagram for the diplexer of FIGS. 7A and 7B, in accordance with systems and methods consistent with the present invention.

FIG. 7C is a frequency response diagram for diplexer 40C of FIGS. 7A and 7B, in accordance with systems and methods consistent with the present invention. The frequency response diagram may be obtained by a computer simulation of diplexer 40C, which may input a predefined signal to terminal 48, such as a sinusoidal signal that may be swept from a first frequency, e.g., 0 Hz to a second frequency, e.g., 18.0 GHz. The plot labeled RET. represents the return loss of the input signal at terminal 48. The first channel, e.g., the 2G channel, is represented by the plot labeled CH.1. The second channel, e.g., the 5G channel, is represented by the plot labeled CH.2.

The computer simulation may use for the resistors, capacitors and inductors of diplexer 40C the following component values: $R_{IN}$=50 ohms, $R_{OUT}$=50 ohms, L2=2.5 nH, L3=8.0 nH, L1=1.0 nH, C1=1.2 pF, C2=0.5 pF, C3=2.6 pF, C4=1.56 pF, L4=5.3 nH, C12=0.5 pF, C13=0.34 pF, C11=2.4 pF, L7=1.7 nH, L9=2.4 nH, L10=0.7 nH, L8=0.8 nH and C14=0.28 pF. The Q-factors for the foregoing inductors and capacitors may comprise 50 and 150, respectively. In the 2G channel, the frequency response diagram shows an insertion loss of about 1.2 dB, while the attenuation at 1990 MHz is approximately 20.0 dB, and the attenuation from 4.9 GHz to 5.9 GHz is over 30.0 dB. In the 5G channel, the frequency response diagram shows an insertion loss of about 0.6 dB and the attenuation is over 30.0 dB at 2.5 GHz.

Figure 8A:
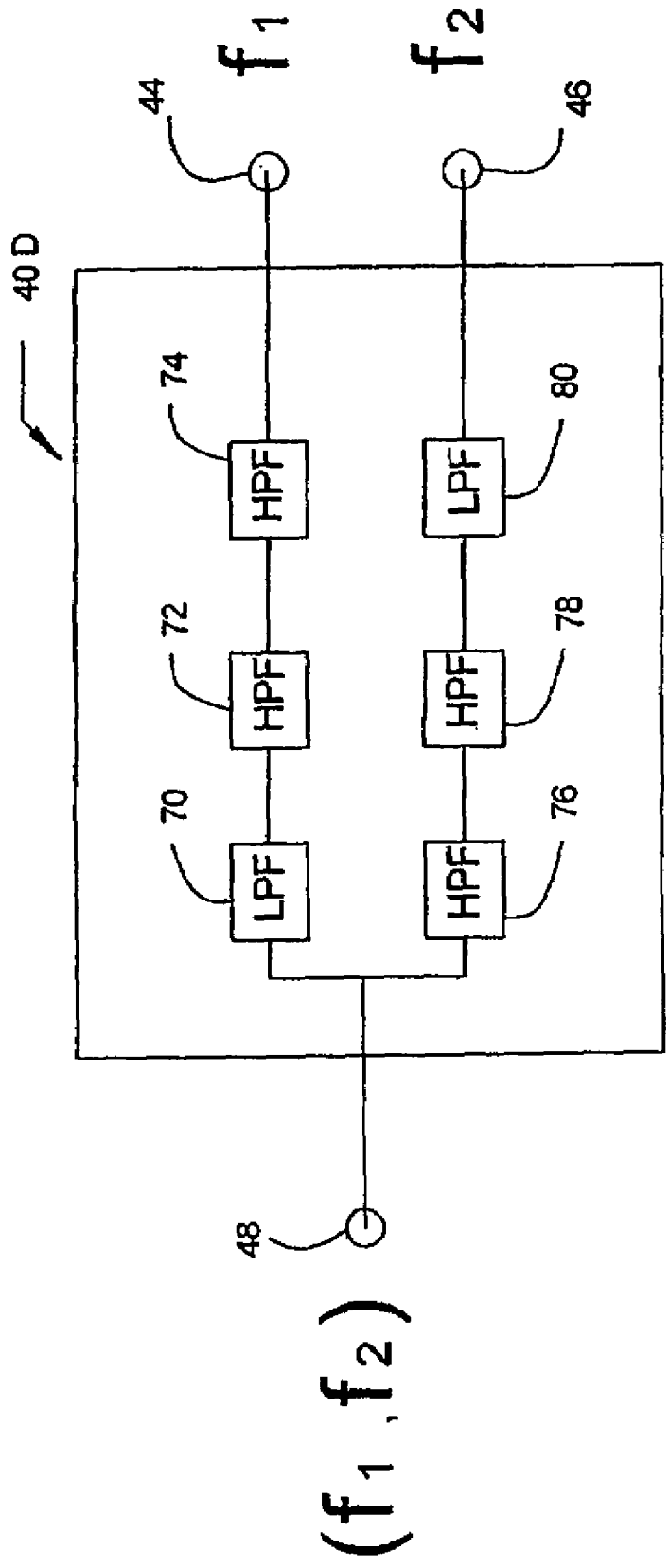
FIG. 8A is a block diagram of another embodiment of a diplexer for use by the communications system of FIG. 3, in accordance with systems and methods consistent with the present invention.

FIG. 8A is a block diagram of another embodiment of a diplexer 40D for use by communications system 34 of FIG. 3, in accordance with systems and methods consistent with the present invention. Diplexer 40D may include three terminals 44-48. Terminal 48 may receive and/or transmit signals that may include frequencies $f_1$ to $f_2$, where frequency $f_1$ may be less than frequency $f_2$. Terminal 44 may receive and/or transmit signals that may include frequency $f_1$ and terminal 46 may receive and/or transmit signals that may include frequency $f_2$.

Diplexer 40D may include a first channel, e.g., the 2G channel, between terminals 48 and 44. In the first channel, diplexer 40D may receive signals, including frequencies $f_1$ and $f_2$, at terminal 48 and employ a bandpass filter, which may comprise a lowpass filter 70 and a pair of highpass filters 72 and 74, to pass signals at frequency $f_1$ to terminal 44. In the first channel, diplexer 40D may also receive from terminal 44 signals, including frequency $f_1$, and employ the bandpass filter, which may comprise lowpass filter 70 and highpass filter 72 and 74, to pass signals including frequency $f_1$ to terminal 48. Employing lowpass filter 70 and highpass filters 72 and 74 to form the bandpass filter in the first channel may ease the task of impedance matching between the first and second channels. Specifically, lowpass filter 70 may provide high impendence, e.g., open-circuit impedance, at the passband frequency of the second channel. Moreover, as compared to diplexer 40C, as shown in FIG. 7A, which employs in its first channel lowpass filter 62 and highpass filter 64, diplexer 40D may have improved attenuation performance by adding one or more additional filters, either one or more lowpass filters, one or more highpass filters, or a combination thereof. In the embodiment shown in FIG. 8A, diplexer 40D may include in its first channel an additional highpass filter to improve attenuation performance, i.e., highpass filter 74 is "an additional highpass filter" relative to highpass filter 72.

Diplexer 40D may also include a second channel, e.g., the 5G channel, between terminals 48 and 46. In the second channel, diplexer 40D may receive signals, including frequencies $f_1$ and $f_2$, at terminal 48 and employ a bandpass filter, which may comprise a pair of highpass filters 76 and 78 and a lowpass filter 80, to pass signals at frequency $f_2$ to terminal 46. In the second channel, diplexer 40D may also receive from terminal 46 signals, including frequency $f_2$, and employ the bandpass filter, which may comprise highpass filters 76 and 78 and lowpass filter 80, to pass signals including frequency $f_2$ to terminal 48. Employing highpass filters 76 and 78 and lowpass filter 80 to form the bandpass filter in the second channel may ease the task of impedance matching between the first and second channels. Specifically, highpass filter 76 may provide high impendence, e.g., open-circuit impedance, at the passband frequency of the first channel. Moreover, as compared to diplexer 40C, as shown in FIG. 7A, which employs in its second channel highpass filter 66 and lowpass filter 68, diplexer 40D may have improved attenuation performance by adding one or more additional filters, either one or more lowpass filters, one or more highpass filters, or a combination thereof. In the embodiment shown in FIG. 8A, diplexer 40D may include in its second channel an additional highpass filter to improve attenuation performance, i.e., highpass filter 78 is "an additional highpass filter" relative to highpass filter 76.

Figure 8B:
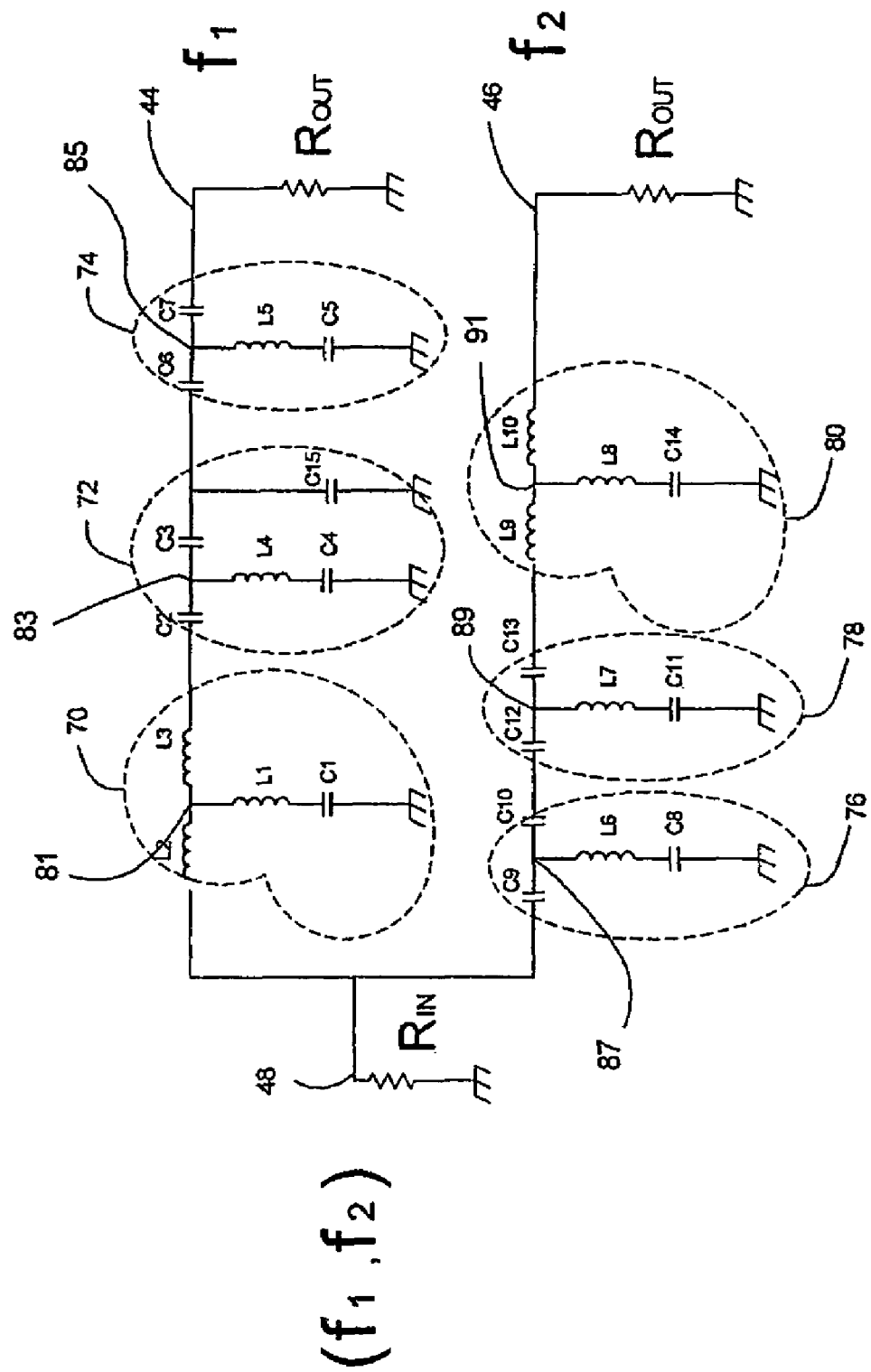
FIG. 8B is an electrical schematic diagram, including the diplexer of FIG. 8A, in accordance with systems and methods consistent with the present invention.

FIG. 8B is an electrical schematic diagram, including diplexer 40D of FIG. 8A, in accordance with systems and methods consistent with the present invention. An input load $R_{IN}$ may be tied from terminal 48 to ground. The input load $R_{IN}$ may represent one or more antennae 38 in communications system 34, as shown in FIG. 3. An output load $R_{OUT}$ may be tied from terminal 44 to ground. This output load $R_{OUT}$ may represent device circuitry 42 in communications system 34. An output load $R_{OUT}$ may be tied from terminal 46 to ground. This output load $R_{OUT}$ may also represent device circuitry 42 in communications system 34.

Regarding the first channel, e.g., the 2G channel, between terminals 48 and 44, a bandpass filter may comprise lowpass filter 70 and highpass filters 72 and 74. Lowpass filter 70 may include a capacitor C1 and inductors L1, L2 and L3. The capacitance value for capacitor C1 and the inductance values for inductors L1, L2 and L3 may be selected to form lowpass filter 70 with any desired lowpass filter performance. Inductor L2 may be coupled between terminal 48 and a node 81. Inductor L1 and capacitor C1 may be coupled in series between node 81 and ground. Inductor L3 may be coupled between node 81 and highpass filter 72.

Highpass filter 72 may include capacitors C2, C3, C4 and C15 and inductor L4. The capacitance values for capacitors C2, C3, C4 and C15 and the inductance value for inductor L4 may be selected to form highpass filter 72 with any desired highpass filter performance. Capacitor C2 may be coupled between lowpass filter 70 and a node 83. Inductor L4 and capacitor C4 may be coupled in series between node 83 and ground. Capacitor C3 may be coupled between node 83 and highpass filter 74, and capacitor C15 may be coupled between highpass filter 74 and ground.

Highpass filter 74 may include capacitors C5, C6 and C7 and inductor L5. The capacitance values for capacitors C5, C6 and C7 and the inductance value for inductor L5 may be selected to form highpass filter 74 with any desired highpass filter performance. Capacitor C6 may be coupled between highpass filter 72 and a node 85. Inductor L5 and capacitor C5 may be coupled in series between node 85 and ground. Capacitor C7 may be coupled between node 85 and terminal 44.

Regarding the second channel, e.g., the 5G channel, a bandpass filter may comprise highpass filters 76 and 78 and lowpass filter 80. Highpass filter 76 may comprise capacitors C8, C9 and C10 and an inductor L6. Capacitance values for capacitors C8, C9 and C10 and the inductance value of inductor L6 may be selected to form highpass filter 76 with any desired highpass filter performance. Capacitor C9 may be coupled between terminal 48 and a node 87. Inductor L6 and capacitor C8 may be coupled in series between node 87 and ground. Capacitor C10 may be coupled between node 87 and highpass filter 78.

Highpass filter 78 may comprise capacitors C11, C12 and C13 and inductor L7. Capacitance values for capacitors C11, C12 and C13 and the inductance value of inductor L7 may be selected to form highpass filter 78 with any desired highpass filter performance. Capacitor C12 may be coupled between highpass filter 76 and a node 89. Inductor L7 and capacitor C11 may be coupled in series between node 89 and ground. Capacitor C13 may be coupled between node 89 and lowpass filter 80.

Lowpass filter 80 may comprise a capacitor C14 and inductors L8, L9 and L10. The capacitance value for capacitor C14 and the inductance values of inductors L8, L9 and L10 may be selected to form lowpass filter 80 with any desired lowpass filter performance. Inductor L9 may be coupled between highpass filter 78 and a node 91. Inductor L8 and capacitor C14 may be coupled in series between node 91 and ground. Inductor L10 may be coupled between node 91 and terminal 46.

Figure 8C:
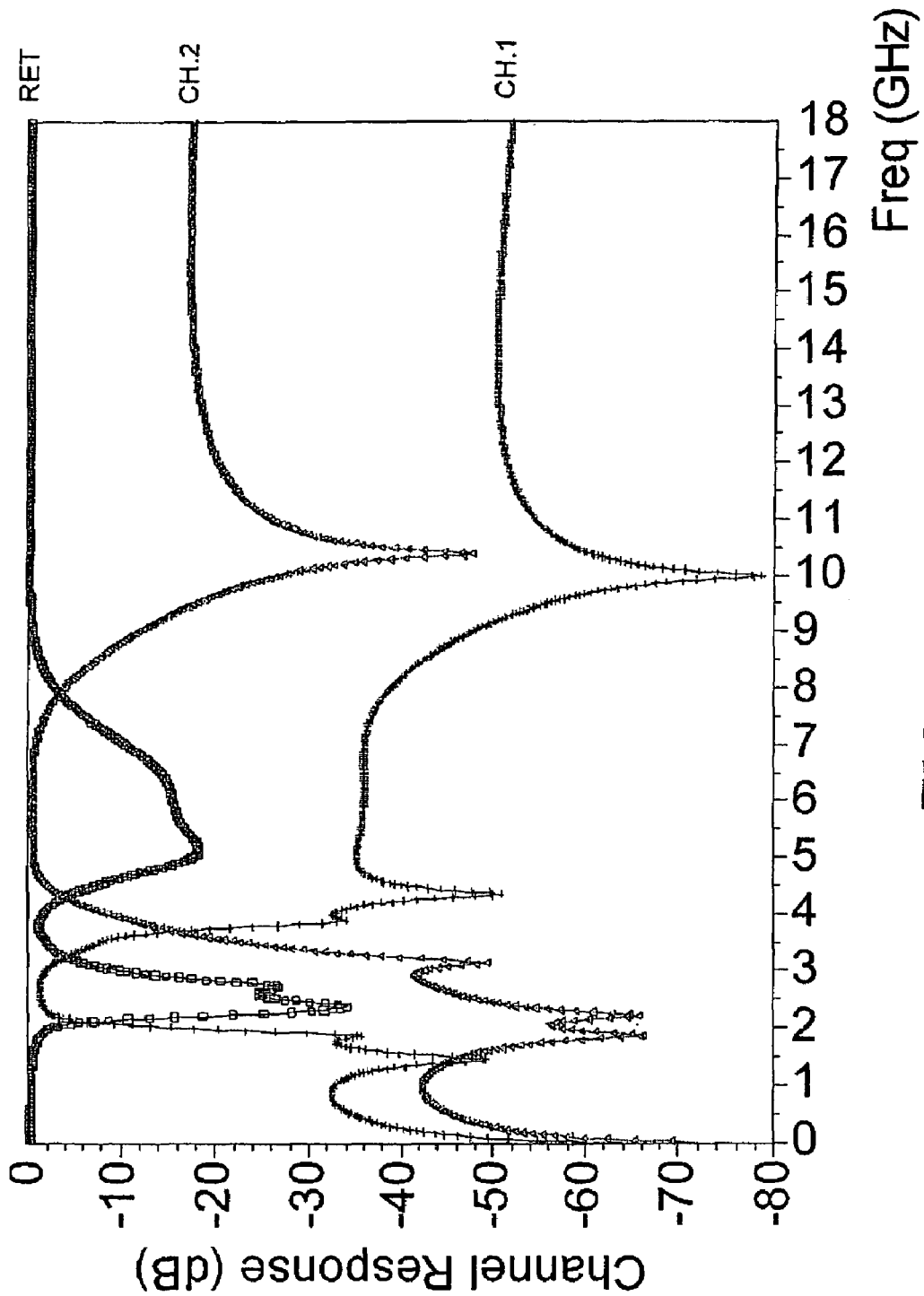
FIG. 8C is a frequency response diagram for the diplexer of FIGS. 8A and 8B, in accordance with systems and methods consistent with the present invention.

FIG. 8C is a frequency response diagram for diplexer 40D of FIGS. 8A and 8B, in accordance with systems and methods consistent with the present invention. The frequency response diagram may be obtained by a computer simulation of diplexer 40D, which may input a predefined signal to terminal 48, such as a sinusoidal signal that may be swept from a first frequency, e.g., 0 Hz to a second frequency, e.g., 18.0 GHz. The plot labeled RET. represents the return loss of the input signal at terminal 48. The first channel, e.g., the 2G channel, is represented by the plot labeled CH.1. The second channel, e.g., the 5G channel, is represented by the plot labeled CH.2.

The computer simulation may use for the resistors, capacitors and inductors of diplexer 40D the following component values: $R_{IN}$=50 ohms, $R_{OUT}$=50 ohms, L1=2.0 nH, L2=3.0 nH, L3=5.4 nH, C1=0.68 pF, C2=0.7 pF, C3=4.6 pF, C4=1.55 pF, C15=2.5 pF, L4=4.6 nH, C5=3.9 pF, C6=2.7 pF, C7=3.0 pF, L5=3.1 nH, C8=3.4 pF, C9=1.0 pF, C10=1.1 pF, L6=1.5 nH, C11=1.3 pF, C12=0.9 pF, C13=0.4 pF, L7=2.0 nH, L8=0.7 nH, L9=2.1 nH, L10=0.7 nH and C14=0.34 pF. The Q-factors for the foregoing inductors and capacitors may comprise 50 and 150, respectively. In the 2G channel, the frequency response diagram shows an insertion loss of about 1.6 dB, while attenuation at the cellular phone frequency of 1800 MHz is over 30.0 dB, and attenuation from 4.9 GHz to 5.9 GHz is over 30.0 dB. In the 5G channel, the frequency response diagram shows an insertion loss of about 1.0 dB, while attenuation from 2.4 GHz to 2.5 GHz is over 40.0 dB and attenuation at 3.25 GHz is approximately 30.0 dB.

Any embodiment of multiplexer 40, such as diplexer embodiments 40A-40D, may be fabricated using any known fabrication process. A process known to those skilled in the art as a low-temperature co-fired ceramic process (hereafter "LTCC process") may be employed. The LTCC process may be employed to produce a plurality of material layers that may form any embodiment of multiplexer 40, such as diplexer embodiments 40A-40D. For example, FIGS. 9A-9F show various perspective views of a three-dimensional circuit layout for diplexer 40D, as shown in FIGS. 8A and 8B, which may be produced with the LTCC process.

Figure 9A:
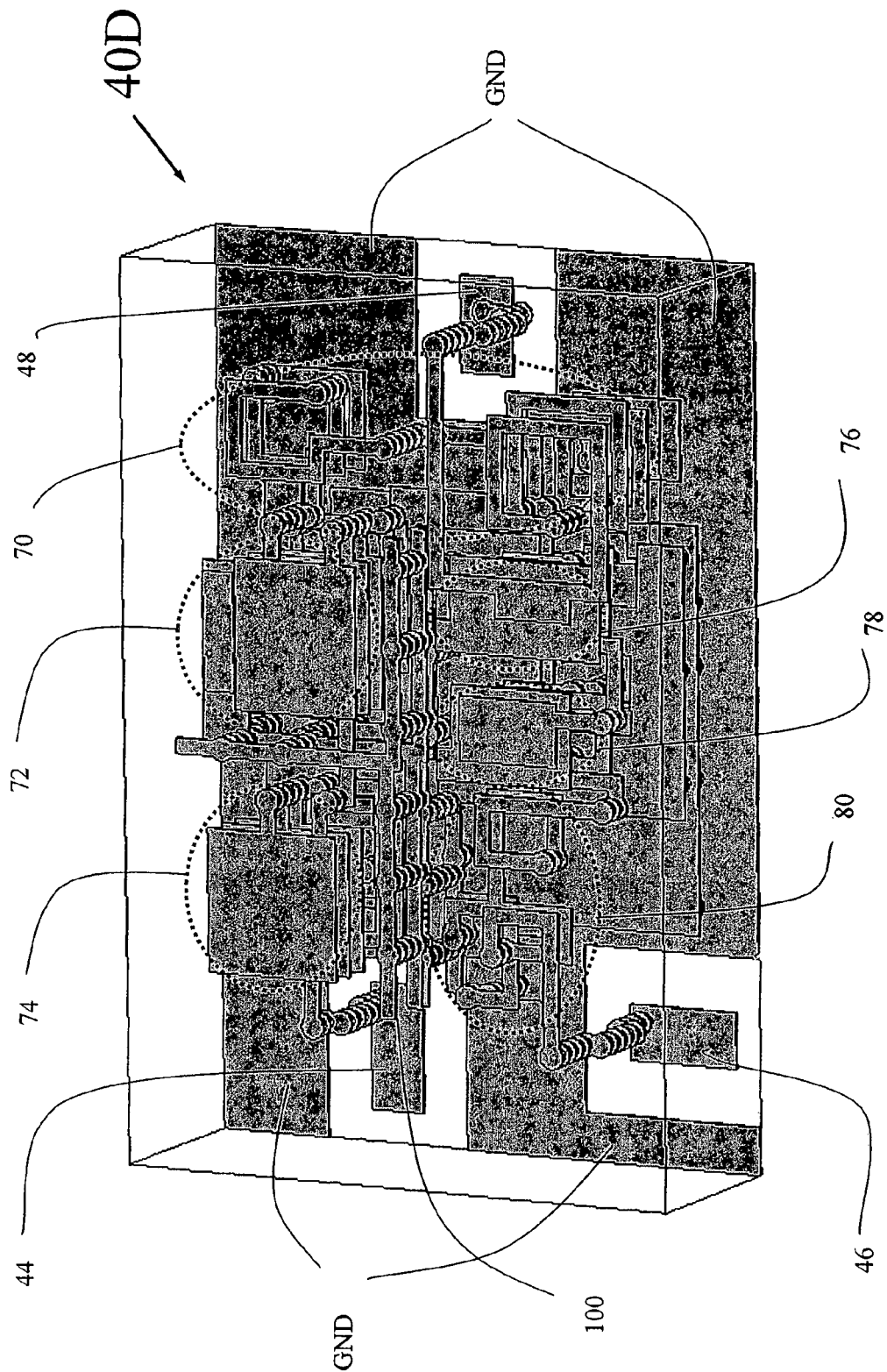
FIG. 9A is a perspective view of a three-dimensional circuit layout that may be used for the diplexer embodiment of FIGS. 8A and 8B, in accordance with systems and methods consistent with the present invention.

Referring to FIG. 9A, diplexer 40D may include a plurality of material layers, e.g., 16 layers of material, such as 16 layers of dielectric material, one or more of which may include one or more layers of metallization material. The dielectric layers may include one or more of any known material and may be formed using one or more of any known process, such as the LTCC process. For example, a dielectric layer may be produced by mixing a dielectric powder, a magnetic powder and a binder agent, and forming the mixture into a layer. The metallization layers may include one or more of any known material and may be formed using one or more of any known process, such as the LTCC process. For example, a metallization layer may include one or more of Ag, Cu, Ni, Au and/or any other suitable material that may be formed, by printing or any other suitable process, into a predefined pattern having a predefined thickness, e.g., 10.0 um. The individual material layers may be stacked, and then bonded, using thermal treatment and/or any other suitable bonding technique.

Via holes may be formed using one or more of any known process, such as the LTCC process. For example, a via hole may be formed in a layer requiring a via hole by using a mechanical punch, a laser or other suitable process to produce a via hole having a predefined shape, and covering the portions of the layer forming the via hole with conductive material. Via holes may be similarly constructed, whether employed to connect inductive coils, or plates to form a capacitor.

Still referring to FIG. 9A, diplexer 40D may be coupled in any known manner, such as mounting on a printed circuit board, with a system, such as communications system 34. Terminal 48 may comprise a metallization portion, which may be located on a bottom surface near the right side of diplexer 40D, as shown in FIG. 9A. Terminals 44 and 46 may also comprise metallization portions, which may be located on the bottom surface near the left side of diplexer 40D. A ground plane may also be located on the bottom surface of diplexer 40D.

The 2G channel of diplexer 40D may comprise lowpass filter 70, highpass filter 72 and highpass filter 74, including the portions identified inside the respective dashed-line indicators, as shown in FIG. 9A. Capacitors, e.g., metal plates, and inductors, e.g., metal coils, may be coupled to form lowpass filter 70, highpass filter 72 and highpass filter 74, as indicated in FIG. 8B. The 5G channel of diplexer 40D may comprise highpass filter 76, highpass filter 78 and lowpass filter 80, including the portions identified inside the respective dashed-line indicators, as shown in FIG. 9A. Capacitors, e.g., metal plates, and inductors, e.g., metal coils, may be coupled to form highpass filter 76, highpass filter 78 and lowpass filter 80, as indicated in FIG. 8B.

A plurality of vias may be formed in a predefined pattern between two or more of the filters in diplexer 40D. For example, as shown in FIG. 9A, a plurality of vias may be interconnected to form a wall-like structure (hereafter "via fence 100"). Via fence 100 may include a section that may extend between filters that may form the 2G channel, i.e., lowpass filter 70, highpass filter 72 and highpass filter 74, and filters that may form the 5G channel, i.e., highpass filter 76, highpass filter 78 and lowpass filter 80. This section of via fence 100 may reduce cross-talk between the 2G channel and the 5G channel. Via fence 100 may also include a section that may extend between highpass filter 72 and highpass filter 74, which may reduce unwanted coupling between highpass filter 72 and highpass filter 74.

Figure 9B:
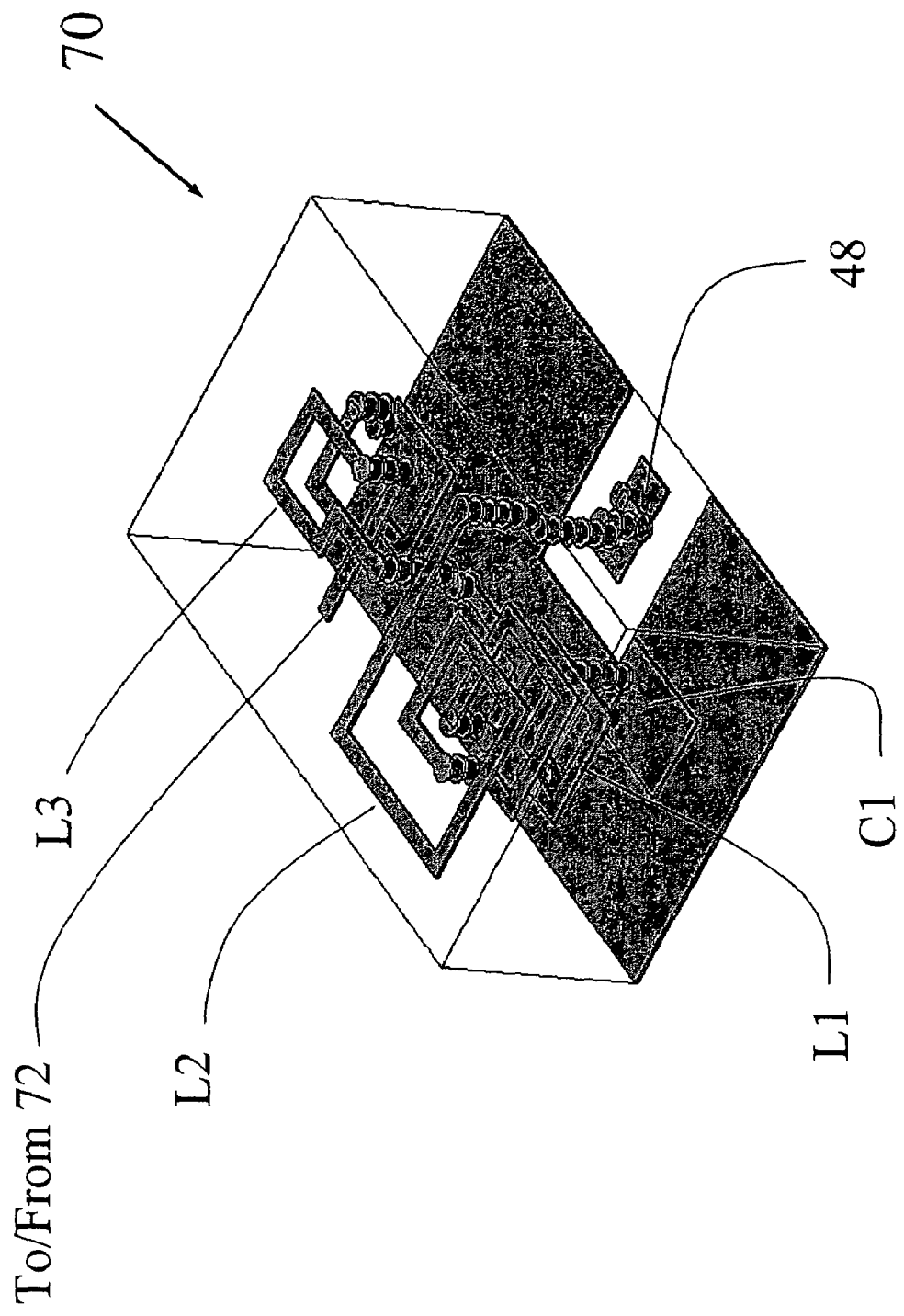
FIG. 9B is a perspective view of a portion of the three-dimensional circuit layout of FIG. 9A, including a lowpass filter for a first channel, in accordance with systems and methods consistent with the present invention.

FIGS. 9B-9F provide a plurality of perspective views of portions of diplexer 40D shown in isolation to illustrate in more detail the three-dimensional circuit layout of diplexer 40D. FIG. 9B illustrates a three-dimensional circuit layout that may be employed for lowpass filter 70, which may include inductors L1, L2 and L3 and capacitor C1, coupled together as shown in FIG. 8B. A predefined separation distance, e.g. 80.0 um, may be employed between adjacent turns in one or more of inductors L1, L2 and L3, so they have a desired self-resonant frequency.

Figure 9C:
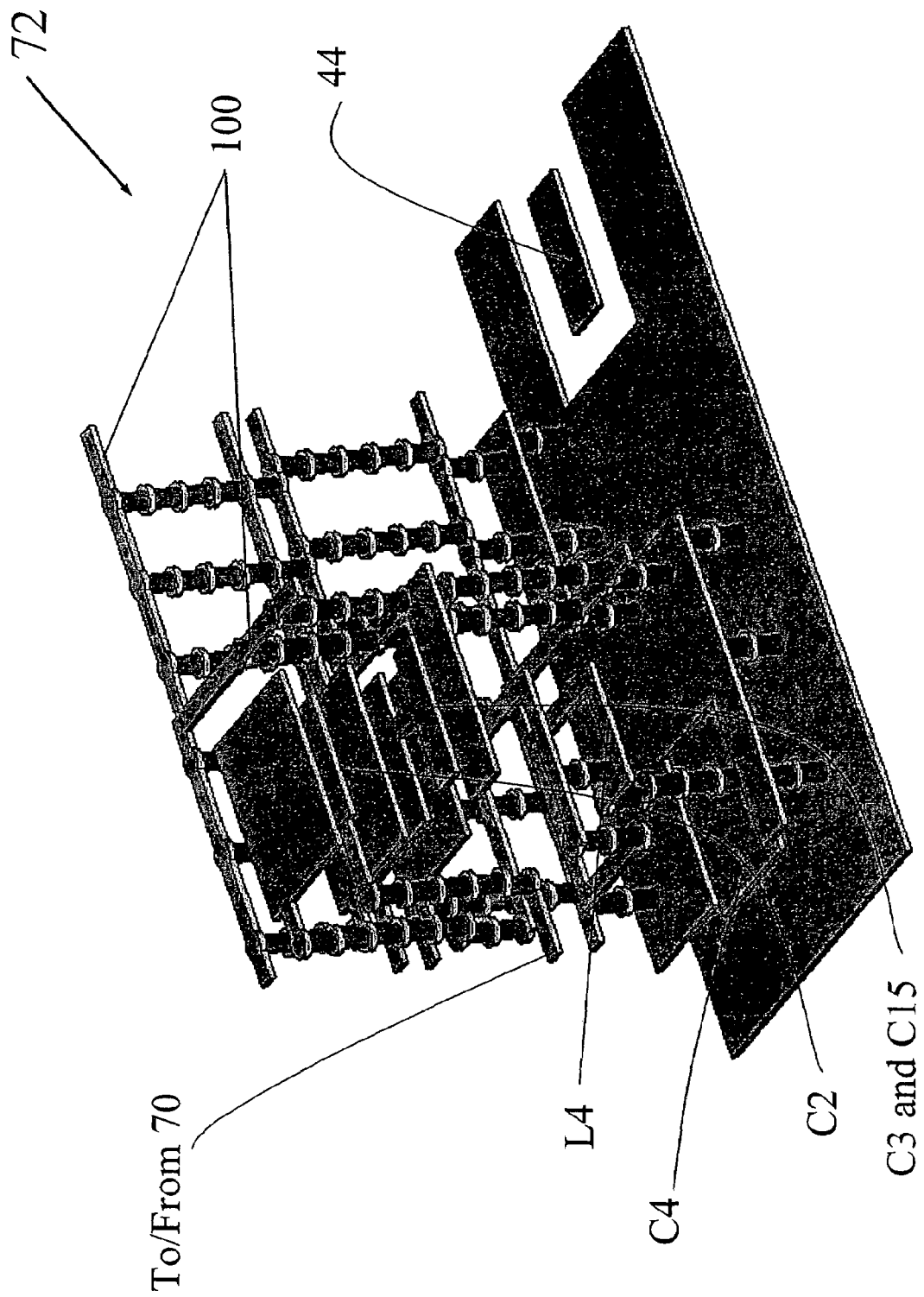
FIG. 9C is a perspective view of another portion of the three-dimensional circuit layout of FIG. 9A, including a first highpass filter for the first channel, in accordance with systems and methods consistent with the present invention.

FIG. 9C illustrates a three-dimensional circuit layout that may be employed for highpass filter 72, which may include inductor L4 and capacitors C2, C3, C4 and C15, coupled together as shown in FIG. 8B. As shown in FIG. 9C, capacitors C2 and C3 may be implemented in a sandwich-type format and share a common electrode connected through multiple, e.g., three, different layers. Capacitor C4 may also be implemented in a sandwich-type format to have a desired capacitance.

Figure 9D:
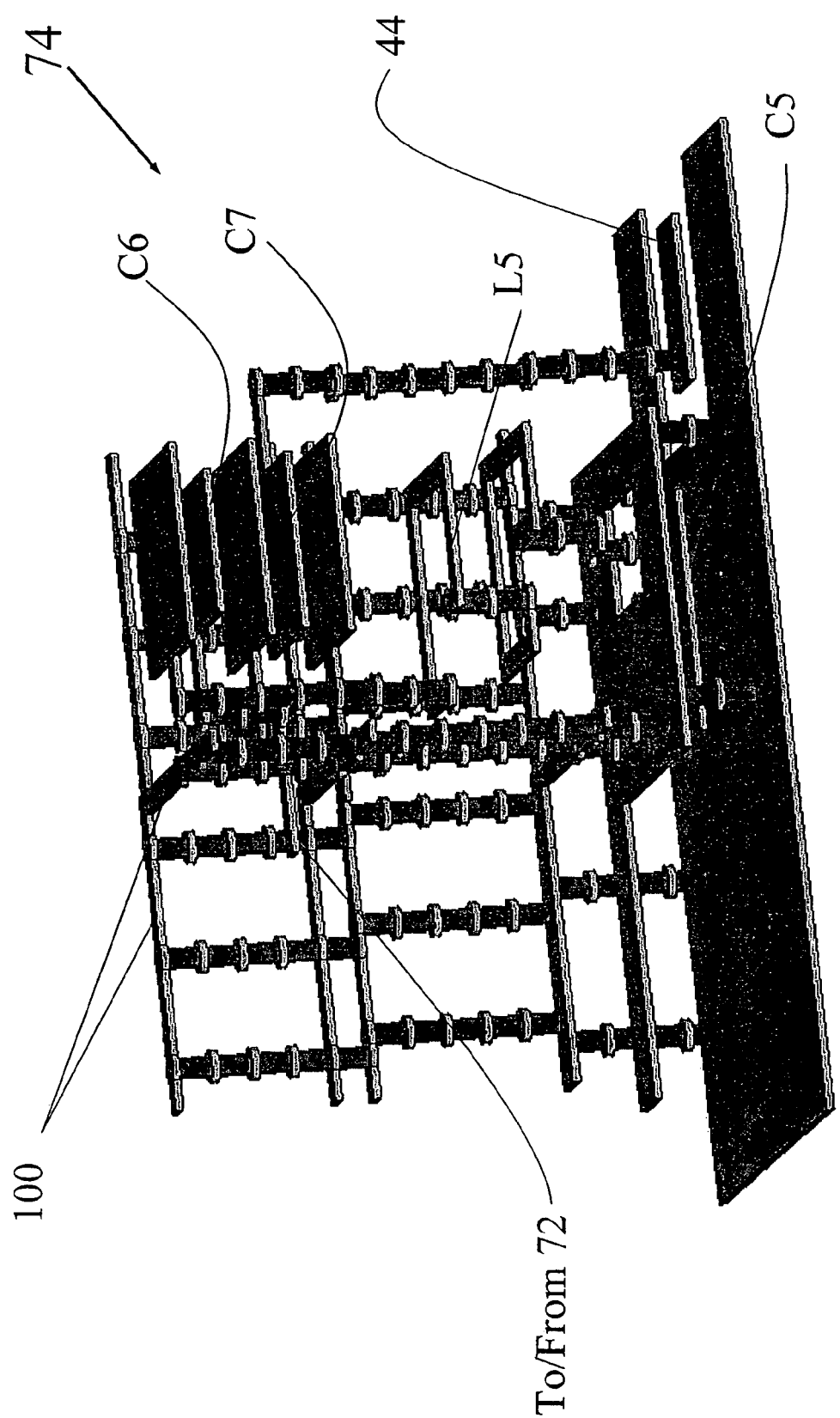
FIG. 9D is a perspective view of another portion of the three-dimensional circuit layout of FIG. 9A, including a second highpass filter for the first channel, in accordance with systems and methods consistent with the present invention.

FIG. 9D illustrates a three-dimensional circuit layout that may be employed for highpass filter 74, which may include inductor L5 and capacitors C5, C6 and C7, coupled together as shown in FIG. 8B. As shown in FIG. 9D, capacitors C5, C6 and C7 may be implemented in a sandwich-type format to have a desired capacitance.

Figure 9E:
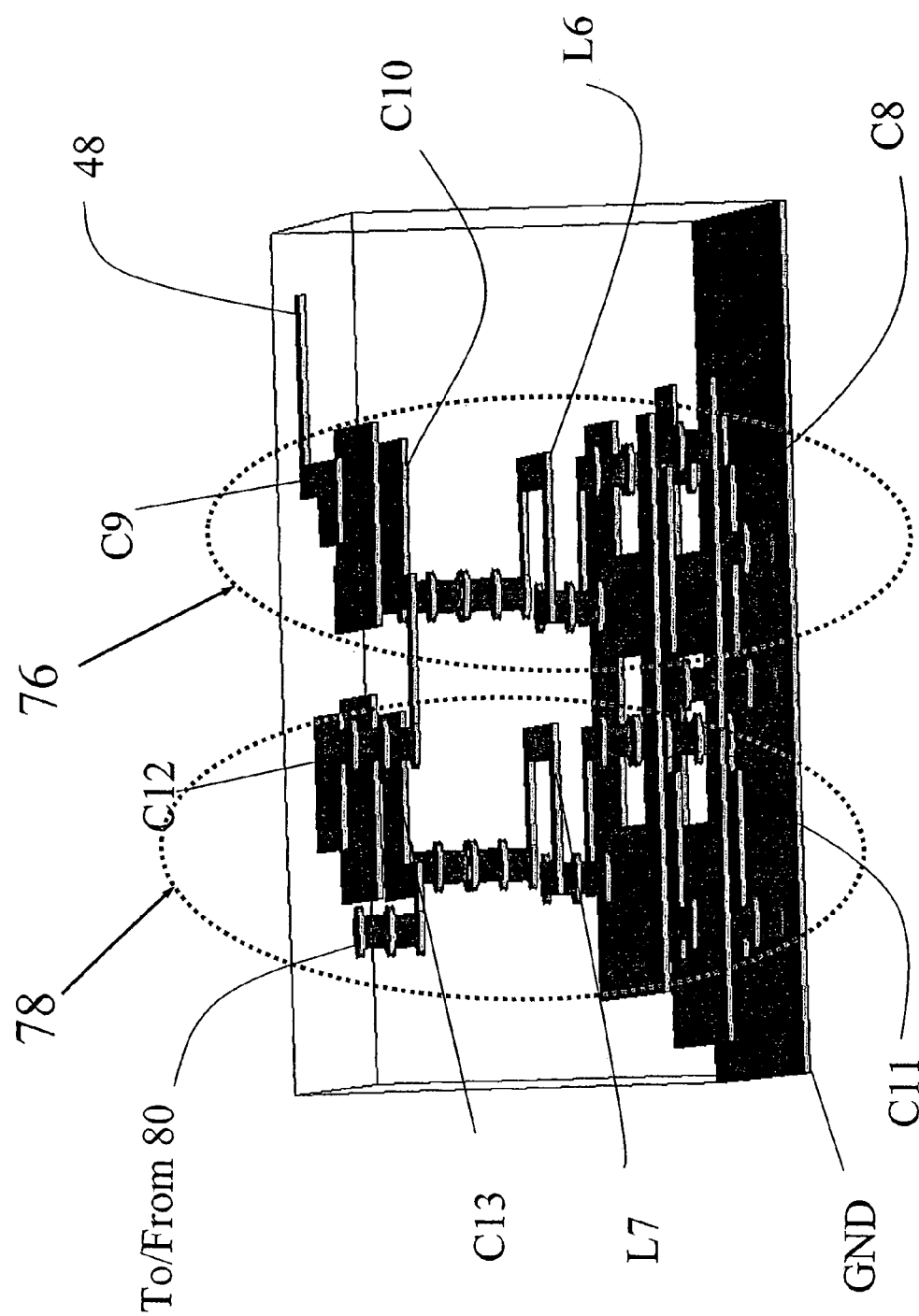
FIG. 9E is a perspective view of another portion of the three-dimensional circuit layout of FIG. 9A, including a pair of highpass filters for a second channel, in accordance with systems and methods consistent with the present invention.

FIG. 9E illustrates a three-dimensional circuit layout that may be employed for highpass filter 76, which may include inductor L6 and capacitors C8, C9 and C10, coupled together as shown in FIG. 8B. FIG. 9E also illustrates a three-dimensional circuit layout that may be employed for highpass filter 78, which may include inductor L7 and capacitors C11, C12 and C13, coupled together as shown in FIG. 8B. As shown, capacitors C9 and C10 may share a common electrode. Capacitor C8 may be implemented in a sandwich-type format to have a desired capacitance. Capacitors C12, C13 and C11 may be similarly implemented as capacitors C9, C10, and C8, respectively.

Figure 9F:
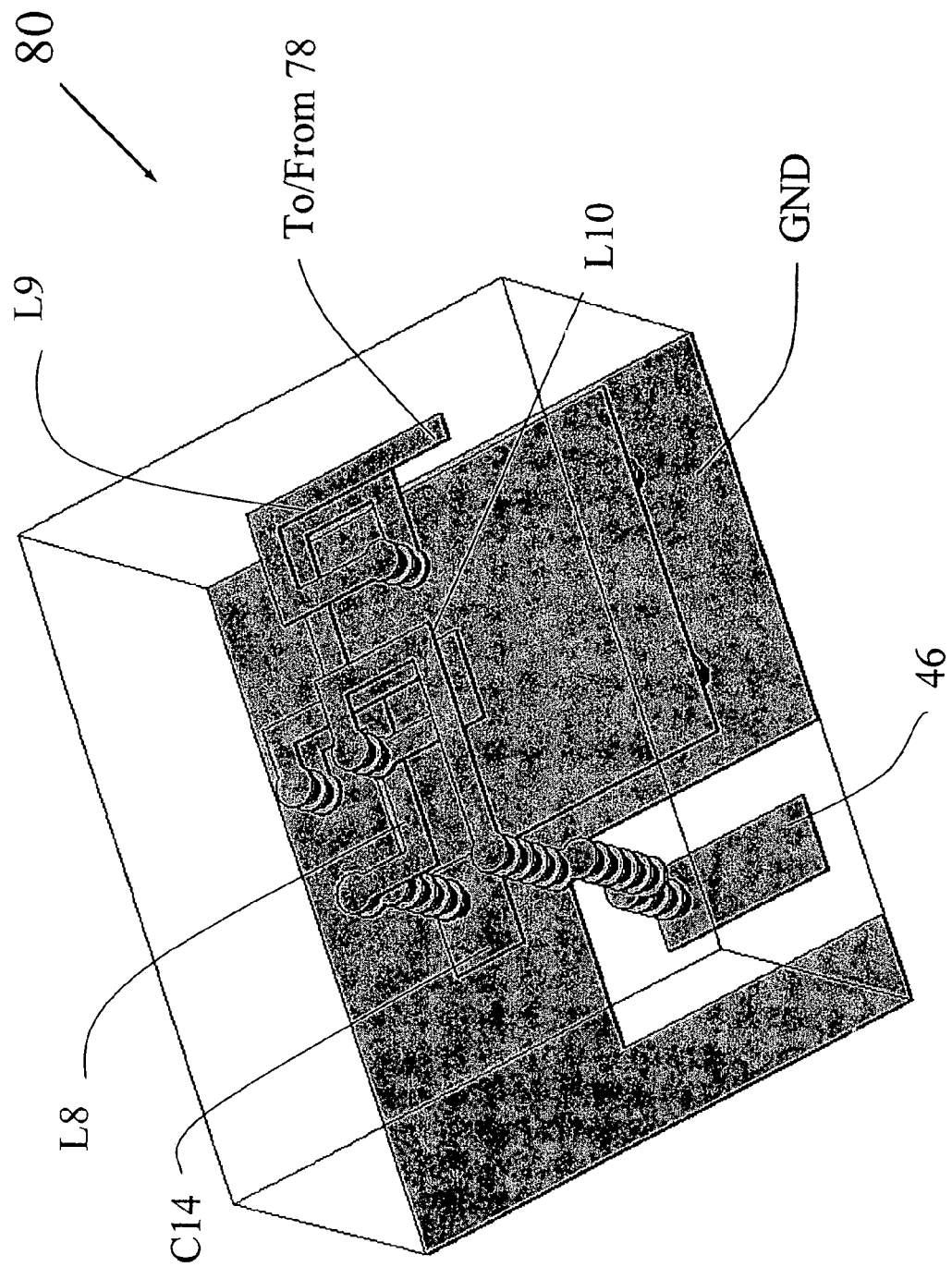
FIG. 9F is a perspective view of another portion of the three-dimensional circuit layout of FIG. 9A, including a lowpass filter for the second channel, in accordance with systems and methods consistent with the present invention.

FIG. 9F illustrates a three-dimensional circuit layout that may be employed for lowpass filter 80, which may include inductors L8, L9 and L10 and capacitor C14, coupled together as shown in FIG. 8B. A predefined separation distance, e.g. 80.0 um, may be employed between adjacent turns in one or more of inductors L8, L9 and L10, so they have a desired self-resonant frequency.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A multiplexer for separating an input signal into at least a first output signal in a first frequency band and a second output signal in a second frequency band, the multiplexer comprising:
   a first bandpass filter having an input for receiving the input signal and an output for passing the first output signal, said first bandpass filter comprising at least a first lowpass filter and a first highpass filter; and
   a second bandpass filter having an input for receiving the input signal and an output for passing the second output signal, said second bandpass filter comprising at least a second lowpass filter and a second highpass filter,
   wherein the first frequency band is lower on a frequency spectrum than the second frequency band,
   wherein the first lowpass filter is coupled in series with the first highpass filter,
   wherein the first lowpass filter precedes the first highpass filter, from the perspective of passing from the input of the first bandpass filter to the output of the first bandpass filter, and
   wherein the multiplexer further includes at least a first additional highpass filter.

2. The multiplexer of claim 1 wherein the first highpass filter is coupled in series with the at least first additional highpass filter.

3. The multiplexer of claim 2 wherein the first lowpass filter precedes the at least first additional highpass filter, from the perspective of passing from the input of the first bandpass filter to the output of the first bandpass filter.

4. The multiplexer of claim 3 wherein the first frequency band and the second frequency band comprise frequency bands for use on a network.

5. The multiplexer of claim 4 wherein the network comprises a wireless local area network.

6. The multiplexer of claim 3 wherein the first bandpass filter and the second bandpass filter are formed by a plurality of material layers adapted to form at least a plurality of lumped inductors and a plurality of lumped capacitors.

7. A multiplexer for separating an input signal into at least a first output signal in a first frequency band and a second output signal in a second frequency band, the multiplexer comprising:
   a first bandpass filter having an input for receiving the input signal and an output for passing the first output signal, said first bandpass filter comprising at least a first lowpass filter and a first highpass filter: and a second bandpass filter having an input for receiving the input signal and an output for passing the second output signal, said second bandpass filter comprising at least a second lowpass filter and a second highpass filter; and
   wherein the first frequency band is lower on a frequency spectrum than the second frequency band. wherein the second lowpass filter is coupled in series with the second highpass filter,
   wherein the second highpass filter precedes the second lowpass filter, from the perspective of passing from the input of the second bandpass filter to the output of the second bandpass filter, and
   wherein the multiplexer further includes at least a second additional highpass filter.

8. The multiplexer of claim 7 wherein the second highpass filter is coupled in series with the at least second additional highpass filter.

9. The multiplexer of claim 8 wherein the at least second additional highpass filter precedes the second lowpass filter, from the perspective of passing from the input of the second bandpass filter to the output of the second bandpass filter.

10. The multiplexer of claim 9 wherein the first frequency band and the second frequency band comprise frequency bands for use on a network.

11. The multiplexer of claim 10 wherein the network comprises a wireless local area network.

12. The multiplexer of claim 9 wherein the first bandpass filter and the second bandpass filter are formed by a plurality of material layers adapted to form at least a plurality of lumped inductors and a plurality of lumped capacitors.

* * * * *